US012677713B2

(12) United States Patent
Jang et al.

(10) Patent No.: US 12,677,713 B2
(45) Date of Patent: Jul. 7, 2026

(54) SEMICONDUCTOR PACKAGE

(71) Applicant: SAMSUNG ELECTRONICS CO., LTD., Suwon-si (KR)

(72) Inventors: Jaegwon Jang, Hwaseong-si (KR); Kyoung Lim Suk, Suwon-si (KR); Minjun Bae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/669,118

(22) Filed: May 20, 2024

(65) Prior Publication Data

US 2024/0312886 A1      Sep. 19, 2024

Related U.S. Application Data

(63) Continuation of application No. 17/453,243, filed on Nov. 2, 2021, now Pat. No. 12,014,975.

(30) Foreign Application Priority Data

Mar. 9, 2021      (KR) ........................ 10-2021-0030913

(51) Int. Cl.
    *H01L 23/498*          (2006.01)
    *H10W 70/65*           (2026.01)
          (Continued)
(52) U.S. Cl.
    CPC ......... *H10W 90/701* (2026.01); *H10W 70/65* (2026.01); *H10W 70/685* (2026.01);
          (Continued)

(58) Field of Classification Search
    None
    See application file for complete search history.

(56)              References Cited

U.S. PATENT DOCUMENTS 8,039,304 B2    10/2011  Pagaila
9,343,442 B2     5/2016  Chen et al.
              (Continued)

FOREIGN PATENT DOCUMENTS

JP        2007-123797 A      5/2007
JP        2017-073458 A      4/2017
              (Continued)

*Primary Examiner* — Long Pham
(74) *Attorney, Agent, or Firm* — Morgan, Lewis & Bockius LLP

(57)              ABSTRACT

A semiconductor package includes a redistribution substrate and a semiconductor chip on a top surface of the redistribution substrate. The redistribution substrate includes an insulating layer, and first, second, and third redistribution patterns disposed in the insulating layer. The first to third redistribution patterns are sequentially stacked in an upward direction and are electrically connected to each other. Each of the first to third redistribution patterns includes a wire portion that extends parallel to the top surface of the redistribution substrate. Each of the first and third redistribution patterns further includes a via portion that extends from the wire portion in a direction perpendicular to the top surface of the redistribution substrate. The second redistribution pattern further includes first fine wire patterns that are less wide than the wire portion of the second redistribution pattern.

19 Claims, 16 Drawing Sheets

(51) Int. Cl.

| | |
|---|---|
| *H10W 70/685* | (2026.01) |
| *H10W 74/10* | (2026.01) |
| *H10W 90/00* | (2026.01) |
| *H10W 72/29* | (2026.01) |

(52) U.S. Cl.

CPC .......... *H10W 74/117* (2026.01); *H10W 72/29* (2026.01); *H10W 90/724* (2026.01)

(56) References Cited

U.S. PATENT DOCUMENTS

| | | | |
|---|---|---|---|
| 9,548,234 | B2 | 1/2017 | Hsu et al. |
| 9,773,749 | B2 | 9/2017 | Pan et al. |
| 9,831,195 | B1 * | 11/2017 | Lu .......................... H01L 23/13 |
| 9,905,440 | B1 | 2/2018 | Baloglu et al. |
| 9,911,672 | B1 | 3/2018 | Wu et al. |
| 9,966,360 | B2 | 5/2018 | Yu et al. |
| 10,157,823 | B2 | 12/2018 | Kim et al. |
| 11,710,715 | B2 | 7/2023 | Lee et al. |
| 11,735,571 | B2 | 8/2023 | Kwon |
| 2017/0278779 | A1 | 9/2017 | Hu |
| 2019/0287895 | A1 * | 9/2019 | Tajima .............. H01L 23/53257 |
| 2020/0219834 | A1 | 7/2020 | Kim et al. |
| 2020/0279804 | A1 | 9/2020 | Huang et al. |
| 2021/0028137 | A1 | 1/2021 | Jeon et al. |
| 2021/0384153 | A1 | 12/2021 | Lee et al. |
| 2021/0407962 | A1 | 12/2021 | Kim et al. |
| 2022/0293501 | A1 | 9/2022 | Jang et al. |
| 2023/0102285 | A1 | 3/2023 | Jin et al. |
| 2023/0154836 | A1 | 5/2023 | Kang et al. |

FOREIGN PATENT DOCUMENTS

| | | | |
|---|---|---|---|
| KR | 10-2013-0079716 | A | 7/2013 |
| KR | 10-2017-0088194 | A | 8/2017 |
| KR | 10-1862004 | B1 | 5/2018 |
| KR | 10-2019-0079943 | A | 7/2019 |
| KR | 10-2020-0029088 | A | 3/2020 |

* cited by examiner

SEMICONDUCTOR PACKAGE

CROSS-REFERENCE TO RELATED APPLICATIONS

This U.S. non-provisional patent application is a continuation of U.S. patent application Ser. No. 17/453,243, filed on Nov. 2, 2021 in the U.S. Patent and Trademark Office, which claims priority under 35 U.S.C. § 119 from Korean Patent Application No. 10-2021-0030913, filed on Mar. 9, 2021 in the Korean Intellectual Property Office, the contents of both of which are herein incorporated by reference in their entireties.

BACKGROUND

Technical Field

Embodiments of the present disclosure are directed to a semiconductor package, and in particular, to a semiconductor package that includes a redistribution substrate.

Discussion of the Related Art

In a semiconductor package, a semiconductor chip is provided to be easily used as a part of an electronic product. Conventionally, a semiconductor package includes a printed circuit board (PCB) and a semiconductor chip, which is mounted on the PCB and is electrically connected to the PCB using bonding wires or bumps.

In a conventional chip-last fan-out package, an under-bump pattern is formed when a redistribution substrate is formed, and then, wires are sequentially formed. In this case, since the under-bump patterns have a large pitch, an insulating layer between the under-bump patterns can shrink and cause an undulation phenomenon in the fine wire patterns. The undulation phenomenon can decrease reliability of the semiconductor package. To suppress the undulation phenomenon, the under-bump pattern is thinly formed. However, this can deteriorate electric characteristics of the semiconductor package.

SUMMARY

An embodiment of the inventive concept provides a semiconductor package with improved reliability and electric characteristics.

According to an embodiment of the inventive concept, a semiconductor package includes a redistribution substrate and a semiconductor chip disposed on a top surface of the redistribution substrate. The redistribution substrate includes an insulating layer, and a first redistribution pattern, a second redistribution pattern, and a third redistribution pattern disposed in the insulating layer. The first to third redistribution patterns are sequentially stacked in a direction from a bottom surface of the redistribution substrate toward the top surface and are electrically connected to each other. Each of the first to third redistribution patterns includes a wire portion that extends in a direction parallel to the top surface of the redistribution substrate. Each of the first and third redistribution patterns furthers include a via portion that extends from the wire portion in a direction perpendicular to the top surface of the redistribution substrate. The second redistribution pattern further includes first fine wire patterns that are less wide than the wire portion of the second redistribution pattern. A distance between adjacent first fine wire patterns ranges from 0.5 µm to 2 µm. The via portion of the first redistribution pattern has a smallest width at a level of a top surface thereof, and the via portion of the third redistribution pattern has a smallest width at a level of a bottom surface thereof.

According to an embodiment of the inventive concept, a semiconductor package includes a redistribution substrate, a semiconductor chip disposed on a top surface of the redistribution substrate, wherein the semiconductor chip includes a chip pad electrically connected to the redistribution substrate, and a conductive terminal disposed on a bottom surface of the redistribution substrate. The redistribution substrate includes an insulating layer, and a first redistribution pattern, a second redistribution pattern, and a third redistribution pattern that are sequentially stacked in a direction from the bottom surface of the redistribution substrate toward the top surface and are electrically connected to each other. Each of the first to third redistribution patterns includes a wire portion that extends in a direction parallel to the top surface of the redistribution substrate. Each of the first and third redistribution patterns further includes a via portion that extends from the wire portion in a direction perpendicular to the top surface of the redistribution substrate. The second redistribution pattern further includes first fine wire patterns that are less wide than the wire portion of the second redistribution pattern. A width of the via portion of the first redistribution pattern gradually decreases in the direction from the bottom surface of the redistribution substrate toward the top surface, and a width of the via portion of the third redistribution pattern gradually increases in the direction from the bottom surface of the redistribution substrate toward the top surface.

According to an embodiment of the inventive concept, a semiconductor package includes a redistribution substrate, a semiconductor chip disposed on a top surface of the redistribution substrate, wherein the semiconductor chip includes a chip pad electrically connected to the redistribution substrate, a mold layer that covers the semiconductor chip, a bonding terminal interposed between the redistribution substrate and the chip pad, and a conductive terminal disposed on a bottom surface of the redistribution substrate. The redistribution substrate includes an under-bump pattern, an insulating layer disposed on the under-bump pattern, a first redistribution pattern disposed on and in contact with the under-bump pattern, a second redistribution pattern disposed on and in contact with the first redistribution pattern, a third redistribution pattern disposed on and in contact with the second redistribution pattern, a fourth redistribution pattern disposed on and in contact with the third redistribution pattern, and a bonding pad disposed on and in contact with the fourth redistribution pattern. The first to fourth redistribution patterns are disposed in the insulating layer, and each of the first to fourth redistribution patterns includes a wire portion that extends in a direction parallel to the top surface of the redistribution substrate. Each of the first, third, and fourth redistribution patterns further includes a via portion that extends from the wire portion in a direction perpendicular to the top surface of the redistribution substrate. The second redistribution pattern further includes first fine wire patterns that are less wide than the wire portion of the second redistribution pattern. The fourth redistribution pattern further includes second fine wire patterns that are less wide than the wire portion of the fourth redistribution pattern. A distance between adjacent first fine wire patterns may range from 0.5 µm to 2 µm. The via portion of the first redistribution pattern has a smallest width at a level of a top surface thereof, and the via portion of the third redistribution pattern has a smallest width at a level of a bottom surface thereof.

BRIEF DESCRIPTION OF THE DRAWINGS

FIG. 4 is a sectional view of a semiconductor package according to an embodiment of the inventive concept.

FIG. 5 is a sectional view of a semiconductor package according to an embodiment of the inventive concept.

DETAILED DESCRIPTION

Embodiments of the inventive concepts will now be described more fully with reference to the accompanying drawings, in which embodiments are shown.

Figure 1:
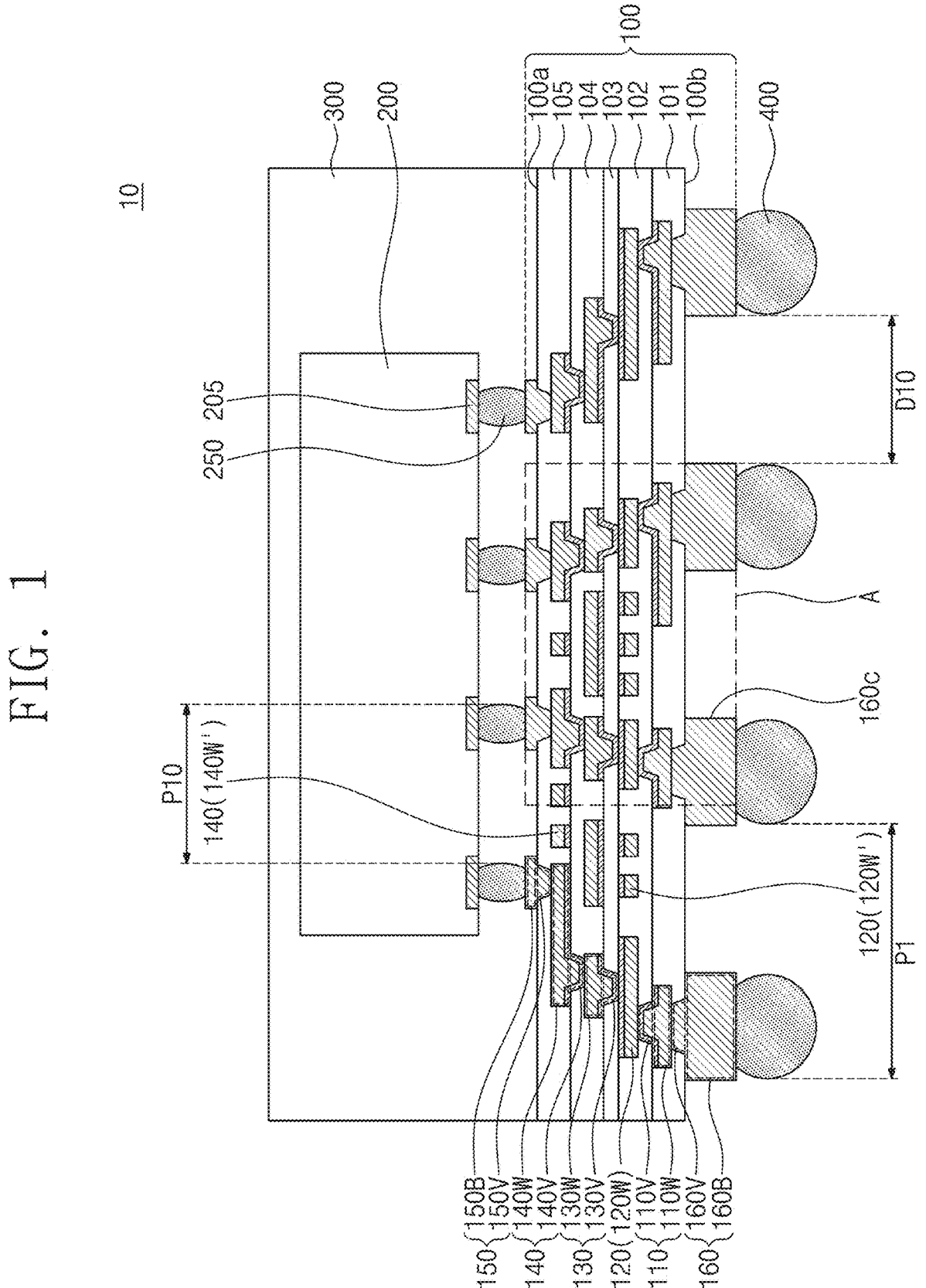
FIG. 1 is a sectional view of a semiconductor package according to an embodiment of the inventive concept.
Figure 2:
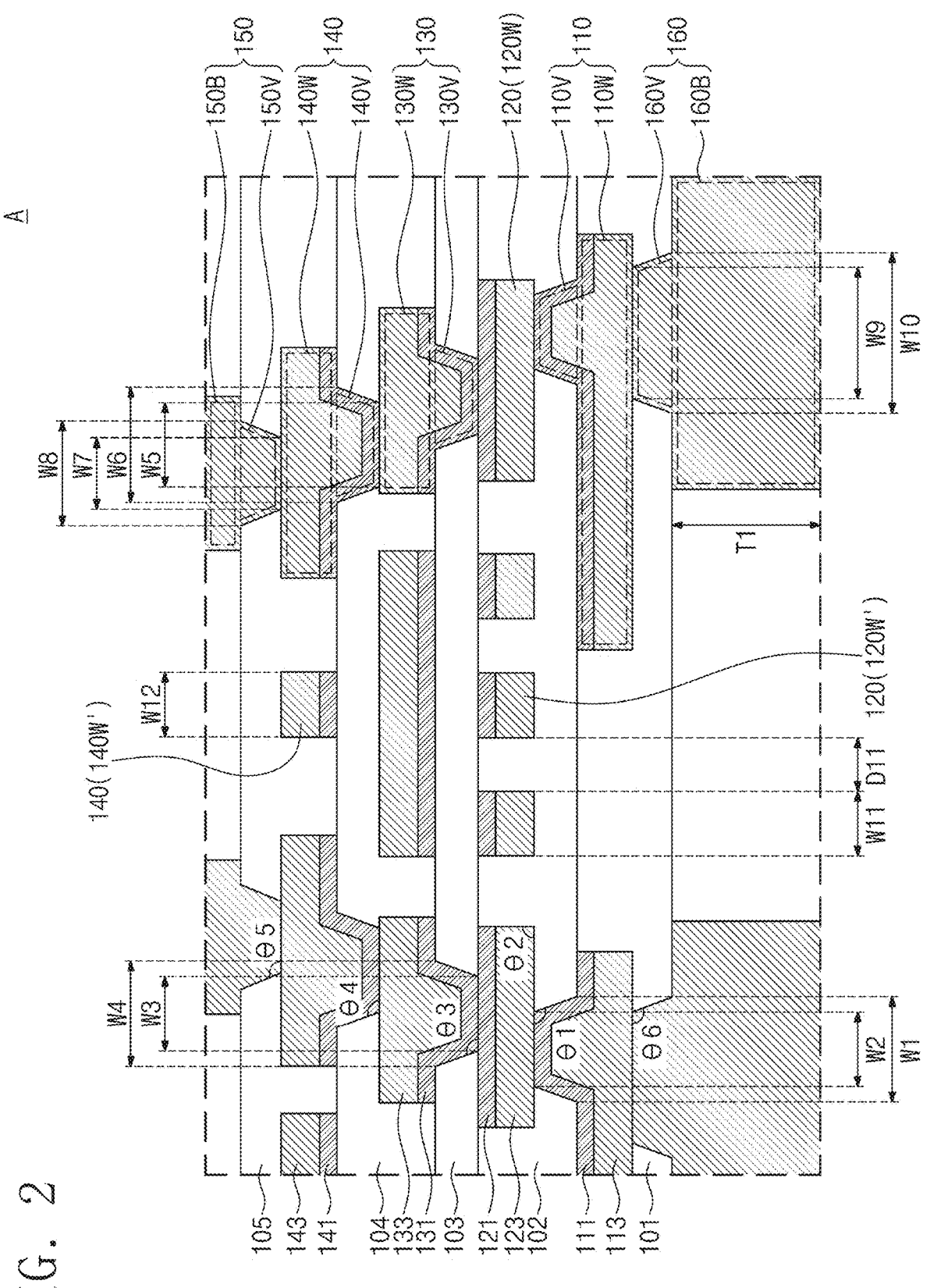
FIG. 2 is an enlarged sectional view of a portion 'A' of FIG. 1.

FIG. 1 is a sectional view of a semiconductor package according to an embodiment of the inventive concept. FIG. 2 is an enlarged sectional view of a portion 'A' of FIG. 1.

Referring to FIGS. 1 and 2, in some embodiments, a semiconductor package 10 includes a redistribution substrate 100 and a semiconductor chip 200. The redistribution substrate 100 includes insulating layers 101, 102, 103, 104, and 105, a first redistribution pattern 110, a second redistribution pattern 120, a third redistribution pattern 130, a fourth redistribution pattern 140, a bonding pad 150, and an under-bump pattern 160. The redistribution substrate 100 includes a top surface 100a and a bottom surface 100b, which are opposite to each other. The insulating layers include first to fifth insulating layers 101, 102, 103, 104, and 105, which are sequentially stacked in a direction from the bottom surface 100b of the redistribution substrate 100 toward the top surface 100a. In other words, the first to fifth insulating layers 101, 102, 103, 104, and 105 are sequentially stacked in a direction perpendicular to the top surface 100a of the redistribution substrate 100. The redistribution substrate 100 may be referred to as an interconnection structure. The top surface 100a of the redistribution substrate 100 is a top surface of the fifth insulating layer 105. The bottom surface 100b of the redistribution substrate 100 is a bottom surface of the first insulating layer 101.

In some embodiments, the under-bump pattern 160 is provided on the bottom surface 100b of the redistribution substrate 100. The under-bump pattern 160 is a pad of a conductive terminal 400, which will be described below. The under-bump pattern 160 is formed of or includes a metal, such as copper. In an embodiment, a distance D10 between two adjacent under-bump patterns 160 ranges from 20 µm to 70 µm. The under-bump pattern 160 has a thickness T1, as shown in FIG. 2. For example, the thickness T1 of the under-bump pattern 160 range from 10 µm to 20 µm.

According to an embodiment of the inventive concept, as will be described below, since the second redistribution pattern 120 is formed in a first step of a semiconductor package fabrication process, an undulation phenomenon can be suppressed or prevented from occurring in first fine wire patterns 120W'. Accordingly, the under-bump pattern 160 need not be thinned to avoid the undulation phenomenon. As a result, the thickness of the under-bump pattern 160 can be increased, which improves the electric characteristics of the semiconductor package.

According to an embodiment, the under-bump pattern 160 includes a via portion 160V that penetrates the first insulating layer 101 and contacts the first redistribution pattern 110, and a body portion 160B below the via portion 160V. A bottom surface of the body portion 160B of the under-bump pattern 160 is not covered by the first insulating layer 101. A side surface 160c of the body portion 160B of the under-bump pattern 160 is not covered by the first insulating layer 101. In other words, the side surface 160c of the body portion 160B of the under-bump pattern 160 is spaced apart from the bottom surface 100b of the redistribution substrate 100. In an embodiment, a portion of the side surface 160c of the body portion 160B of the under-bump pattern 160 is in contact with the first insulating layer 101. In other words, the side surface 160c of the body portion 160B extends away from the bottom surface 100b of the redistribution substrate 100 in a direction perpendicular to the bottom surface 100b of the redistribution substrate 100. The via portion 160V of the under-bump pattern 160 extends from the body portion 160B in a direction perpendicular to the top surface 100a of the redistribution substrate 100.

In an embodiment, the first insulating layer 101 is disposed on the under-bump pattern 160. The first insulating layer 101 covers a side surface of the via portion 160V of the under-bump pattern 160. The first insulating layer 101 is a lowermost insulating layer. A bottom surface of the via portion 160V of the under-bump pattern 160 is substantially coplanar with the bottom surface 100b of the redistribution substrate 100. The first insulating layer 101 is formed of or includes an organic material, such as a photosensitive polymer. In a present embodiment, the photosensitive polymer includes at least one of, for example, a photo-sensitive polyimide, a polybenzoxazole, a phenol-based polymer, or a benzocyclobutene-based polymer. The first insulating layer 101 is a positive type photosensitive polymer, but embodiments of the inventive concept are not limited thereto.

In an embodiment, the first redistribution pattern 110 is disposed on the under-bump pattern 160. The first redistribution pattern 110 includes a first via portion 110V and a first wire portion 110W. The first wire portion 110W is disposed in the first insulating layer 101. The first wire portion 110W is disposed between the under-bump pattern 160 and the first via portion 110V. The first wire portion 110W is in contact with a top surface of the via portion 160V of the under-bump pattern 160. A top surface of the first wire portion 110W is substantially coplanar with the top surface of the first insulating layer 101.

In an embodiment, the first via portion 110V is disposed on and connected to the first wire portion 110W. The first via portion 110V extends from the first wire portion 110W in a direction perpendicular to the top surface 100a of the redistribution substrate 100. In detail, the first via portion 110V extends from the first wire portion 110W in a direction from the bottom surface 100b of the redistribution substrate 100 toward the top surface 100a. The first wire portion 110W is wider and longer than the first via portion 110V. The first via portion 110V is disposed on the top surface of the first insulating layer 101. The first via portion 110V is disposed in the second insulating layer 102.

In an embodiment, a width of the first via portion 110V is less than a width of the via portion 160V of the under-bump pattern 160. An angle between top and side surfaces of the first via portion 110V is a first angle θ1. The first angle θ1 is an obtuse angle. For example, the first angle θ1 ranges from 95° to 135°. An angle θ6 between top and side surfaces of the via portion 160V of the under-bump pattern 160 is an obtuse angle. For example, the angle θ6 between the top and side surfaces of the via portion 160V of the under-bump pattern 160 ranges from 95° to 135°.

In an embodiment, the largest width of the first via portion 110V is a first width W1. The smallest width of the first via portion 110V is a second width W2. The first via portion 110V has a tapered shape. A width of the first via portion 110V gradually decreases in a direction from the bottom surface 100b of the redistribution substrate 100 toward the top surface 100a. In other words, a width of a top surface of the first via portion 110V is the second width W2, and a width of the lowermost portion of the first via portion 110V is the first width W1. Here, the lowermost portion of the first via portion 110V is an interface between the first via portion 110V and the first wire portion 110W. The lowermost portion of the first via portion 110V is substantially coplanar with the top surface of the first insulating layer 101.

In an embodiment, the first redistribution pattern 110 includes a first seed pattern 111 and a first conductive pattern 113. The first conductive pattern 113 is disposed on the top surface of the first insulating layer 101 and at least a portion thereof is disposed in the first insulating layer 101. The first conductive pattern 113 is in contact with the under-bump pattern 160. The first conductive pattern 113 is formed of or includes a metal, such as copper. The first seed pattern 111 is interposed between the first conductive pattern 113 and the second insulating layer 102 and between the first conductive pattern 113 and the second redistribution pattern 120. The first seed pattern 111 is not in contact with the under-bump pattern 160. The first seed pattern 111 is formed of or includes at least one conductive material, such as copper or titanium, and/or alloys thereof.

In an embodiment, each of the first via portion 110V and the first wire portion 110W includes the first seed pattern 111 and the first conductive pattern 113. The first seed pattern 111 of the first via portion 110V is directly connected to the first seed pattern 111 of the first wire portion 110W without any interface therebetween. The first seed pattern 111 is interposed between the top surface of the first via portion 110V and the second redistribution pattern 120, between the side surface of the first via portion 110V and the second insulating layer 102, and between the top surface of the first wire portion 110W and the second insulating layer 102. The first seed pattern 111 does not extend onto side and bottom surfaces of the first conductive pattern 113 of the first wire portion 110W. The first conductive pattern 113 of the first via portion 110V is directly connected to the first conductive pattern 113 of the first wire portion 110W.

In an embodiment, the second insulating layer 102 is disposed on the first insulating layer 101 and covers the top surface of the first insulating layer 101 and the side surface of the first via portion 110V. The second insulating layer 102 includes, for example, a photo-sensitive polymer. There may be no observable interface between the first and second insulating layers 101 and 102, but embodiments of the inventive concept are not limited thereto.

In an embodiment, the second redistribution pattern 120 is disposed on the first redistribution pattern 110 and is electrically connected to the first redistribution pattern 110. The second redistribution pattern 120 includes a second wire portion 120W and the first fine wire patterns 120W'. The second wire portion 120W and the first fine wire patterns 120W' are disposed in the second insulating layer 102.

In an embodiment, the second wire portion 120W is in contact with the first via portion 110V of the first redistribution pattern 110. In detail, a bottom surface of the second wire portion 120W is in contact with the top surface of the first via portion 110V. A top surface of the second wire portion 120W is substantially coplanar with a top surface of the second insulating layer 102. An angle between bottom and side surfaces of the second wire portion 120W is a second angle θ2. The second angle θ2 is smaller than the first angle θ1. For example, the second angle θ2 ranges from 85° to 95°.

In an embodiment, the first fine wire patterns 120W' are not in contact with the first redistribution pattern 110. The first fine wire patterns 120W' are disposed between adjacent second wire portions 120W. In each of the first fine wire patterns 120W', angles between the top and side surfaces thereof and between the bottom and side surfaces thereof range from 85° to 95°. A width of the first fine wire patterns 120W' is less than a width of the second wire portion 120W. For example, a width W11 of each of the first fine wire patterns 120W' ranges from 0.5 μm to 2 μm. A distance D11 between adjacent first fine wire patterns 120W' may range from 0.5 μm to 2 μm.

According to an embodiment of the inventive concept, the second redistribution pattern 120, which includes the first fine wire patterns 120W', can be formed in advance, and in this case, an undulation phenomenon of the first fine wire patterns 120W' can be suppressed. As a result, the reliability of the semiconductor package can be improved. This will be described in more detail below.

In an embodiment, the second redistribution pattern 120 includes a second seed pattern 121 and a second conductive pattern 123. For example, each of the second wire portion 120W and the first fine wire patterns 120W' includes the second seed pattern 121 and the second conductive pattern 123. The second seed pattern 121 is be interposed between the second conductive pattern 123 and the third insulating layer 103. The second seed pattern 121 is disposed on a top surface of the second conductive pattern 123. The second conductive pattern 123 is in contact with the first redistribution pattern 110. The second seed pattern 121 is not in contact with the first redistribution pattern 110. The second seed pattern 121 does not extend onto side and bottom surfaces of the second conductive pattern 123. The second seed pattern 121 is formed of or includes at least one of the afore-described materials for the first seed pattern 111. The second conductive pattern 123 is formed of or includes at least one of the afore-described materials for the first conductive pattern 113.

In an embodiment, the third insulating layer 103 is disposed on the second insulating layer 102. The third insulating layer 103 covers a top surface of the second redistribution pattern 120. The third insulating layer 103 is in contact with at least a portion of the second seed pattern 121. The third insulating layer 103 includes, for example, a photosensitive polymer. The third insulating layer 103 may include the same material as the second insulating layer 102. There may be no observable interface between the second and third insulating layers 102 and 103, but embodiments of the inventive concept are not limited thereto. A thickness of the third insulating layer 103 is less than a thickness of the second insulating layer 102.

In an embodiment, the third redistribution pattern 130 is disposed on and electrically connected to the second redistribution pattern 120. The third redistribution pattern 130 includes a third wire portion 130W and a second via portion 130V.

In an embodiment, the second via portion 130V is disposed in the third insulating layer 103. The second via portion 130V is interposed between the second redistribution pattern 120 and the third wire portion 130W. An angle between bottom and side surfaces of the second via portion 130V is a third angle θ3. The third angle θ3 is substantially equal to the first angle θ1. For example, the third angle θ3 ranges from 95° to 135°.

In an embodiment, the second via portion 130V extends from the third wire portion 130W in a direction perpendicular to the top surface 100a of the redistribution substrate 100. In detail, the second via portion 130V extends from the third wire portion 130W in a direction from the top surface 100a of the redistribution substrate 100 toward the bottom surface 100b. The third wire portion 130W is wider or longer than the second via portion 130V. A bottom surface of the second via portion 130V is in contact with the top surface of the second wire portion 120W.

In an embodiment, the smallest width of the second via portion 130V is a third width W3. The largest width of the second via portion 130V is a fourth width W4. The second via portion 130V has a tapered shape. A width of the second via portion 130V gradually increases in a direction from the bottom surface 100b of the redistribution substrate 100 toward the top surface 100a. In other words, a width of the second via portion 130V at a level of a bottom surface thereof is the third width W3, and a width of the uppermost portion of the second via portion 130V is the fourth width W4. Here, the uppermost portion of the first via portion 110V is an interface between the second via portion 130V and the third wire portion 130W. The uppermost portion of the second via portion 130V is substantially coplanar with a top surface of the third insulating layer 103.

In an embodiment, the third width W3 is substantially equal to the second width W2. The fourth width W4 is substantially equal to the first width W1. For example, a ratio of the second width W2 to the third width W3 ranges from 0.8 to 1.2, and a ratio of the first width W1 to the fourth width W4 ranges from 0.8 to 1.2.

In an embodiment, the third wire portion 130W is disposed on the second via portion 130V and on the top surface of the third insulating layer 103. The third wire portion 130W is disposed in the fourth insulating layer 104. The third wire portion 130W is electrically connected to the second via portion 130V. A bottom surface of the third wire portion 130W is substantially coplanar with the top surface of the third insulating layer 103.

In an embodiment, the third redistribution pattern 130 includes a third seed pattern 131 and a third conductive pattern 133. The third conductive pattern 133 is disposed on the top surface of the third insulating layer 103 and includes at least a portion in the third insulating layer 103. The third seed pattern 131 is interposed between the second redistribution pattern 120 and the third conductive pattern 133 and between the third conductive pattern 133 and the third insulating layer 103. The third seed pattern 131 is in contact with the second redistribution pattern 120. In detail, the third seed pattern 131 is in contact with the second seed pattern 121 of the second redistribution pattern 120.

In an embodiment, each of the second via portion 130V and the third wire portion 130W includes the third seed pattern 131 and the third conductive pattern 133. The third seed pattern 131 is provided on a bottom surface of the third conductive pattern 133 of the second via portion 130V and is interposed between a side surface of the third conductive pattern 133 of the second via portion 130V and the third insulating layer 103 and between the bottom surface of the third conductive pattern 133 of the third wire portion 130W and the third insulating layer 103. The third seed pattern 131 extends to side and top surfaces of the third conductive pattern 133 of the third wire portion 130W. The third seed pattern 131 is formed of or includes at least one of the afore-described materials for the first seed pattern 111. The third conductive pattern 133 is formed of or includes at least one of the afore-described materials for the first conductive pattern 113.

In an embodiment, the fourth insulating layer 104 is disposed on the third insulating layer 103. The fourth insulating layer 104 covers top and side surfaces of the third wire portion 130W of the third redistribution pattern 130. The fourth insulating layer 104 includes, for example, a photosensitive polymer. The fourth insulating layer 104 is formed of or includes substantially the same material as the third insulating layer 103. There may be no observable interface between the third and fourth insulating layers 103 and 104, but embodiments of the inventive concept are not limited to this example. The fourth insulating layer 104 is thicker than the third insulating layer 103.

In an embodiment, the fourth redistribution pattern 140 is disposed on the third redistribution pattern 130 and is electrically connected to the third redistribution pattern 130. The fourth redistribution pattern 140 includes a fourth wire portion 140W and a third via portion 140V.

In an embodiment, the third via portion 140V is disposed in the fourth insulating layer 104. The third via portion 140V is interposed between the third redistribution pattern 130 and the fourth wire portion 140W. An angle between bottom and side surfaces of the third via portion 140V is a fourth angle θ4. The fourth angle θ4 is substantially equal to the first angle θ1. For example, the fourth angle θ4 ranges from 95° to 135°.

In an embodiment, the third via portion 140V extends from the fourth wire portion 140W in a direction perpendicular to the top surface 100a of the redistribution substrate 100. In detail, the third via portion 140V extends from the fourth wire portion 140W in a direction from the top surface 100a of the redistribution substrate 100 toward the bottom surface 100b. The fourth wire portion 140W is wider or longer than the third via portion 140V.

In an embodiment, the smallest width of the third via portion 140V is a fifth width W5. The largest width of the third via portion 140V is a sixth width W6. The third via portion 140V has a tapered shape. A width of the third via portion 140V gradually increases in a direction from the bottom surface 100b of the redistribution substrate 100 toward the top surface 100a. In other words, a width of a bottom surface of the third via portion 140V is the fifth width W5, and a width of the uppermost portion of the third via portion 140V is the sixth width W6. Here, the uppermost portion of the third via portion 140V is an interface between the third via portion 140V and the fourth wire portion 140W. The uppermost portion of the third via portion 140V is substantially coplanar with a top surface of the fourth insulating layer 104. The sixth width W6 is substantially equal to the fourth width W4. The fifth width W5 is substantially equal to the third width W3.

In an embodiment, the fourth wire portion 140W is disposed on the third via portion 140V and on the top surface of the fourth insulating layer 104. The fourth wire portion 140W is disposed in the fifth insulating layer 105. The fourth wire portion 140W is electrically connected to the third via portion 140V. A bottom surface of the fourth wire portion 140W is substantially coplanar with the top surface of the fourth insulating layer 104.

In an embodiment, the fourth redistribution pattern 140 includes a fourth seed pattern 141 and a fourth conductive pattern 143. The fourth conductive pattern 143 is disposed on the top surface of the fourth insulating layer 104 and includes at least a portion in the fourth insulating layer 104. The fourth seed pattern 141 is interposed between the third redistribution pattern 130 and the fourth conductive pattern 143 and between the fourth conductive pattern 143 and the fourth insulating layer 104. The fourth seed pattern 141 is in contact with the third redistribution pattern 130. In detail, the fourth seed pattern 141 is in contact with the third conductive pattern 133 of the third redistribution pattern 130.

In an embodiment, each of the third via portion 140V and the fourth wire portion 140W includes the fourth seed pattern 141 and the fourth conductive pattern 143. The fourth seed pattern 141 is disposed on a bottom surface of the fourth conductive pattern 143 of the third via portion 140V and is interposed between a side surface of the fourth conductive pattern 143 of the third via portion 140V and the fourth insulating layer 104 and between the bottom surface of the fourth conductive pattern 143 of the fourth wire portion 140W and the fourth insulating layer 104. The fourth seed pattern 141 does not extend to side and top surfaces of the fourth conductive pattern 143 of the fourth wire portion 140W. The fourth seed pattern 141 is formed of or includes at least one of the afore-described materials for the first seed pattern 111. The fourth conductive pattern 143 is formed of or includes at least one of the afore-described materials for the first conductive pattern 113.

In an embodiment, the fourth redistribution pattern 140 further includes second fine wire patterns 140W'. The second fine wire patterns 140W' are disposed in the fifth insulating layer 105. The second fine wire patterns 140W' are not in contact with the third redistribution pattern 130. The second fine wire patterns 140W' are disposed between adjacent fourth wire portions 140W. In each of the second fine wire patterns 140W', an angle between the top and side surfaces thereof and an angle between the bottom and side surfaces thereof ranges from 85° to 95°. A width of the second fine wire patterns 140W' is less than a width of the fourth wire portion 140W. For example, a width W12 of each of the second fine wire patterns 140W' ranges from 0.5 μm to 2 μm. A distance between adjacent second fine wire patterns 140W' ranges from 0.5 μm to 2 μm. Each of the second fine wire patterns 140W' includes the fourth seed pattern 141 and the fourth conductive pattern 143. The fourth conductive pattern 143 is disposed on a top surface of the fourth seed pattern 141.

In an embodiment, the fifth insulating layer 105 is disposed on the fourth insulating layer 104 and covers the top surface of the fourth insulating layer 104 and the top and side surfaces of the fourth wire portion 140W. The fifth insulating layer 105 is formed of or includes, for example, a photosensitive polymer. The fifth insulating layer 105 is formed of or includes the same material as the fourth insulating layer 104. There may be no observable interface between the fourth and fifth insulating layers 104 and 105, but embodiments of the inventive concept are not limited to this example.

The number of the stacked insulating layers 101, 102, 103, 104, and 105 and the number of the redistribution patterns 110, 120, 130, and 140 are not limited to the illustrated examples and may vary in other embodiments.

In an embodiment, the bonding pad 150 is disposed on a top surface of the fourth redistribution pattern 140. The bonding pad 150 is electrically connected to the fourth redistribution pattern 140. The bonding pad 150 is formed of or includes at least one conductive material. For example, the bonding pad 150 is formed of or includes at least one metal, such as copper, titanium, aluminum, or tungsten, and/or alloys thereof.

In an embodiment, the bonding pad 150 includes a via portion 150V that penetrates the fifth insulating layer 105 and contacts the fourth redistribution pattern 140, and a body portion 150B disposed on the via portion 150V. A side surface of the body portion 150B of the bonding pad 150 is not covered with the fifth insulating layer 105. A bottom surface of the body portion 150B of the bonding pad 150 is substantially coplanar with the top surface of the fifth insulating layer 105.

In an embodiment, the smallest width of the via portion 150V of the bonding pad 150 is a seventh width W7. The largest width of the via portion 150V of the bonding pad 150 is an eighth width W8. The via portion 150V of the bonding pad 150 has a tapered shape. A width of the via portion 150V of the bonding pad 150 gradually increases in a direction from the bottom surface 100b of the redistribution substrate 100 toward the top surface 100a. In other words, a width of a bottom surface of the via portion 150V of the bonding pad 150 is the seventh width W7, and a width of the uppermost portion of the via portion 150V of the bonding pad 150 is the eighth width W8. The uppermost portion of the via portion 150V of the bonding pad 150 is an interface between the via portion 150V and the body portion 150B of the bonding pad 150. The uppermost portion of the via portion 150V of the bonding pad 150 is substantially coplanar with the top surface of the fifth insulating layer 105. The seventh width W7 is substantially equal to the third width W3. The eighth width W8 is substantially equal to the fourth width W4.

In an embodiment, an angle between bottom and side surfaces of the via portion 150V of the bonding pad 150 is a fifth angle θ5. The fifth angle θ5 is substantially equal to the first angle θ1. For example, the fifth angle θ5 ranges from 95° to 135°.

In an embodiment, the smallest width of the via portion 160V of the under-bump pattern 160 is a ninth width W9. The largest width of the via portion 160V of the under-bump pattern 160 is a tenth width W10. The via portion 160V of the under-bump pattern 160 has a tapered shape. A width of the via portion 160V of the under-bump pattern 160 gradually decreases in a direction from the bottom surface 100b of the redistribution substrate 100 toward the top surface 100a. In other words, a width of a top surface of the via portion 160V of the under-bump pattern 160 is the ninth width W9, and a width of the lowermost portion of the via portion 160V of the under-bump pattern 160 is the tenth width W10. The lowermost portion of the via portion 160V of the under-bump pattern 160 is an interface between the via portion 160V and the body portion 160B of the under-bump pattern 160. The lowermost portion of the via portion 160V of the under-bump pattern 160 is substantially coplanar with the bottom surface of the first insulating layer 101. A width of the via portion 160V of the under-bump pattern 160 is greater than a width of the first via portion 110V. For example, the ninth width W9 is greater than the second width W2, and the tenth width W10 is greater than the first width W1.

In an embodiment, the semiconductor chip 200 is mounted on the top surface 100a of the redistribution substrate 100. The semiconductor chip 200 includes a chip pad 205. Near a bottom surface of the semiconductor chip 200, the chip pad 205 is externally exposed. In addition, at least one integrated circuit is provided in the semiconductor chip 200.

In an embodiment, a bonding terminal 250 is provided between the chip pad 205 of the semiconductor chip 200 and the bonding pad 150 that electrically connects the chip pad 205 to the bonding pad 150. The bonding terminal 250 includes at least one of a solder pillar or a solder bump. The bonding terminal 250 is formed of or includes at least one conductive material, such as a soldering material. For example, the soldering material includes at least one of tin, bismuth, lead, or silver, or alloys thereof. The semiconductor chip 200 is electrically connected to the redistribution substrate 100 through the bonding terminal 250.

In an embodiment, the semiconductor package 10 further includes a mold layer 300. The mold layer 300 is disposed on the redistribution substrate 100 and covers the semiconductor chip 200. The mold layer 300 covers the uppermost insulating layer of the insulating layers 101, 102, 103, 104, and 105. The uppermost insulating layer is the fifth insulating layer 105. The mold layer 300 extends into a gap region between the semiconductor chip 200 and the redistribution substrate 100 and hermetically seals or encapsulates the bonding terminal 250. The mold layer 300 is formed of or includes at least one insulating polymer, such as an epoxy molding compound. In addition, in an embodiment, an under-fill layer is disposed in the gap region between the redistribution substrate 100 and the semiconductor chip 200.

In an embodiment, a conductive terminal 400 is disposed on the bottom surface 100b of the redistribution substrate 100. The conductive terminal 400 is disposed on a bottom surface of the body portion 160B of the under-bump pattern 160 and is electrically connected to the under-bump pattern 160. The conductive terminal 400 is in contact with the under-bump pattern 160. Thus, the conductive terminal 400 is electrically connected to the semiconductor chip 200 through the first to fourth redistribution patterns 110, 120, 130, and 140, the bonding pads 150, and the bonding terminal 250. The conductive terminal 400 is formed of or includes at least one of a solder bump, a solder pillar, and/or combinations thereof. The conductive terminal 400 is formed of or includes at least one soldering material. The conductive terminal 400 is formed by a solder-ball-attaching process.

FIGS. 3A to 3H are sectional views that illustrate a method of fabricating a semiconductor package, according to an embodiment of the inventive concept.

Figure 3A:
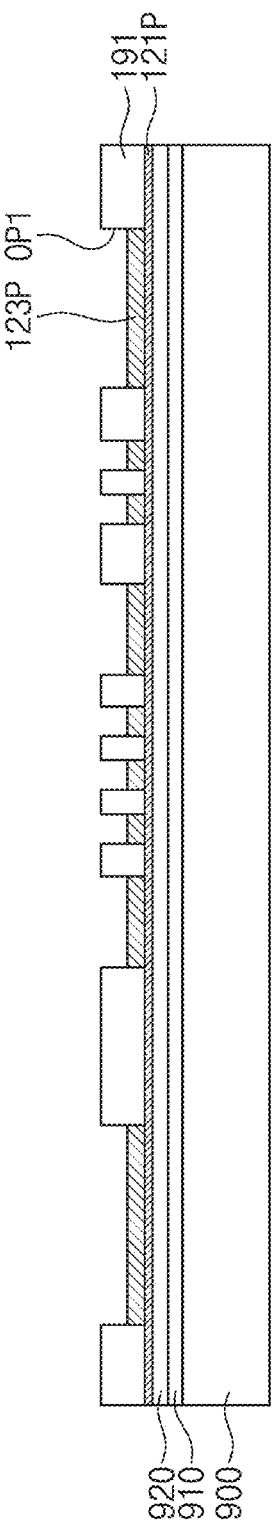
FIGS. 3A to 3H are sectional views that illustrate a method of fabricating a semiconductor package, according to an embodiment of the inventive concept.

Referring to FIG. 3A, in an embodiment, a first carrier substrate 900, a first release layer 910, and an etch stop layer 920 are sequentially formed. A first seed layer 121P is formed on the etch stop layer 920. The first seed layer 121P conformally covers a top surface of the etch stop layer 920. The first seed layer 121P can be formed by a deposition process. The first seed layer 121P is formed of or includes at least one conductive material. For example, the first seed layer 121P is formed of or includes at least one conductive material, such as copper or titanium, and/or alloys thereof.

In an embodiment, a first resist pattern 191 is formed on the first seed layer 121P. The first resist pattern 191 is formed of or includes a photoresist material. A first opening OP1 is formed in the first resist pattern 191 that exposes a top surface of the first seed layer 121P. An angle between bottom and side surfaces of the first opening OP1 ranges from 85° to 95°.

In an embodiment, a first conductive layer 123P is formed in the first opening OP1 that covers the first seed layer 121P. The first conductive layer 123P is formed by an electroplating process, in which the first seed layer 121P is used as an electrode. The first conductive layer 123P does not extend onto a top surface of the first resist pattern 191. Thus, an additional planarization process need not be performed in a process of forming the first conductive layer 123P. The first conductive layer 123P is formed of or includes a metal, such as copper.

Figure 3B:
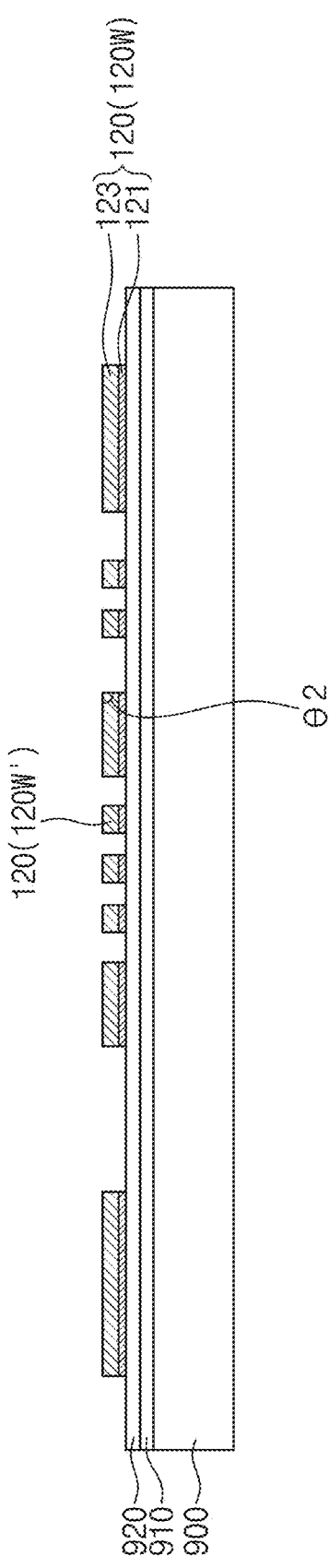

Referring to FIG. 3B, in an embodiment, a first portion of the first seed layer 121P is exposed by removing the first resist pattern 191. The exposed first portion of the first seed layer 121P is removed by an etching process. During the etching process, the first conductive layer 123P has an etch selectivity with respect to the first seed layer 121P. A second portion of the first seed layer 121P disposed below a bottom surface of the first conductive layer 123P is not removed by the etching process. After the etching process, the remaining portion, i.e., the second portion, of the first seed layer 121P forms the second seed pattern 121, and the first conductive layer 123P forms the second conductive pattern 123. As a result, the second redistribution pattern 120 is formed. The second redistribution pattern 120 includes the second seed pattern 121 and the second conductive pattern 123. In an embodiment, the second redistribution pattern 120 includes the second wire portion 120W and the first fine wire patterns 120W'. A width of the first fine wire patterns 120W' is less than a width of the second wire portion 120W. An angle θ2 between top and side surfaces of the second redistribution pattern 120 ranges from 85° to 95°.

In an embodiment, when the under-bump pattern is formed in advance, the fine wire patterns are formed on an insulating layer between the under-bump patterns. Here, the insulating layer between the under-bump patterns can shrink during a curing process, and in this case, an undulation phenomenon can occur in the fine wire patterns. According to an embodiment of the inventive concept, the second redistribution pattern 120 is formed in advance, and in this case, the undulation phenomenon of the first fine wire patterns 120W' can be suppressed. As a result, the reliability of the semiconductor package can be improved.

Figure 3C:
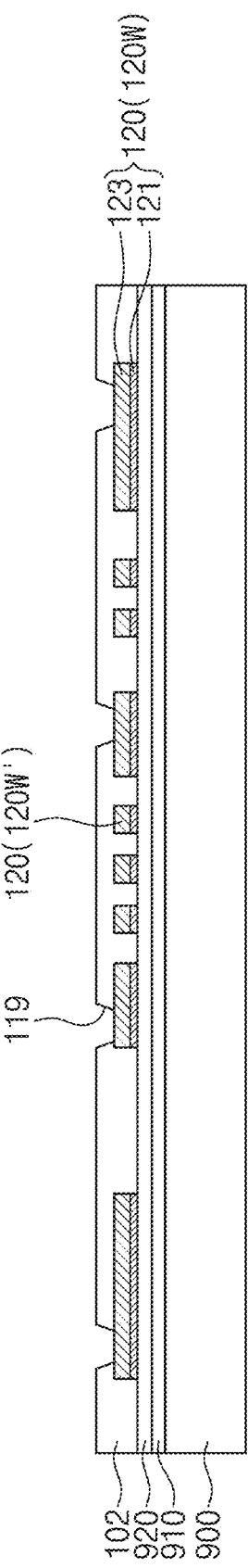

Referring to FIG. 3C, in an embodiment, the second insulating layer 102 is formed on the second redistribution pattern 120. The second insulating layer 102 is formed by a coating process, such as a spin coating process or a slit coating process. The second insulating layer 102 includes, for example, a photo-sensitive polymer. The second insulating layer 102 covers the top surface of the etch stop layer 920, the top and side surfaces of the second wire portion 120W, and the top and side surfaces of the first fine wire patterns 120W'.

In an embodiment, the second insulating layer 102 is patterned to form a first hole 119. The patterning of the second insulating layer 102 is performed through an exposure process and a developing process. The first hole 119 has a tapered shape. For example, a diameter of an upper portion of the first hole 119 is larger than a diameter of a lower portion of the first hole 119. The first hole 119 exposes a top surface of the second redistribution pattern 120. An angle between bottom and side surfaces of the first hole 119 is an obtuse angle. For example, the angle between the bottom and side surfaces of the first hole 119 ranges from 95° to 135°.

Figure 3D:
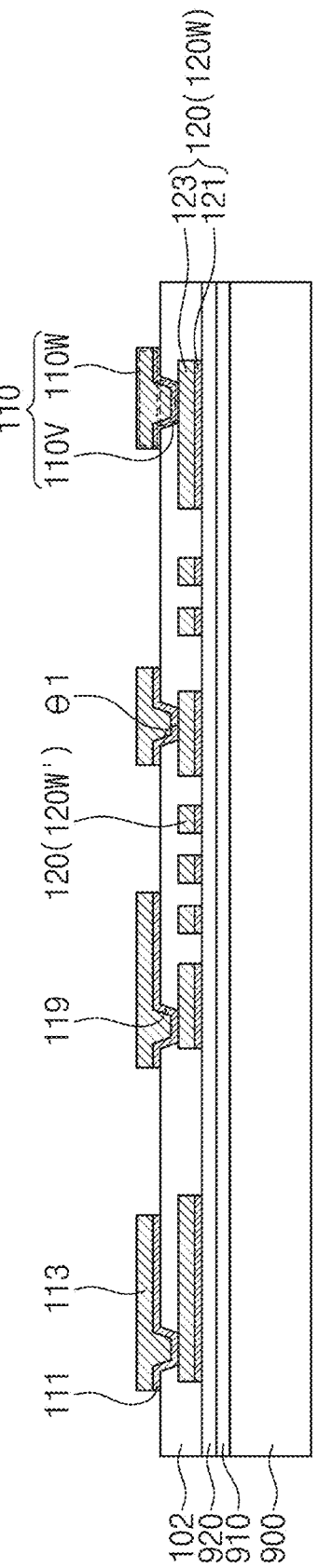

Referring to FIG. 3D, in an embodiment, the first redistribution pattern 110 is formed on the second redistribution pattern 120. The first redistribution pattern 110 fills the first holes 119. The forming of the first redistribution pattern 110 is performed by the same method as that for the second redistribution pattern 120. For example, the formation of the first redistribution pattern 110 includes forming a second seed layer that covers the top surface of the second insulating layer 102 and the first hole 119, forming a second resist pattern that has a second opening on the second seed layer, forming a second conductive layer in the second opening, removing the second resist pattern to expose a portion of the second seed layer, and etching the exposed portion of the second seed layer to form the first seed pattern 111. As a result of the etching process, the first conductive pattern 113 is formed from the second conductive layer.

In an embodiment, the first redistribution pattern 110 includes the first seed pattern 111 and the first conductive pattern 113. The first redistribution pattern 110 includes the first via portion 110V and the first wire portion 110W. The first via portion 110V is a portion of the first redistribution pattern 110 that is formed in the first hole 119. The first wire portion 110W is formed on the first via portion 110V. The first wire portion 110W is formed on the top surface of the second insulating layer 102. An angle θ1 between bottom and side surfaces of the first via portion 110V ranges from 95° to 135°.

Figure 3E:
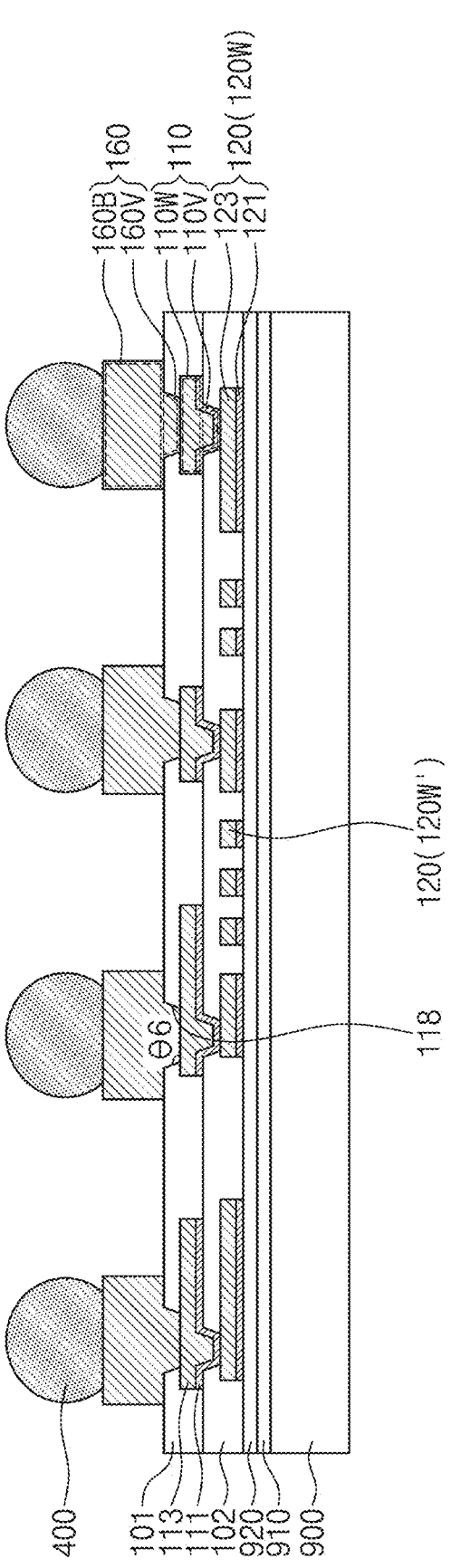

Referring to FIG. 3E, in an embodiment, the first insulating layer 101 is formed on the first redistribution pattern 110. The first insulating layer 101 is formed by a coating process. The first insulating layer 101 includes, for example, a photosensitive polymer. The first insulating layer 101 covers the top surface of the second insulating layer 102 and the top and side surfaces of the first wire portion 110W.

In an embodiment, the first insulating layer 101 is patterned to form a second hole 118. The patterning of the first insulating layer 101 is performed using an exposure process and a developing process. The second hole 118 has a tapered shape. For example, a diameter of an upper portion of the second hole 118 is greater than a diameter of a lower portion of the second hole 118. The second hole 118 exposes a top surface of the first redistribution pattern 110. An angle between bottom and side surfaces of the second hole 118 is an obtuse angle. For example, the angle between the bottom and side surfaces of the second hole 118 ranges from 95° to 135°.

In an embodiment, the under-bump pattern 160 is formed to fill the second hole 118. The under-bump pattern 160 includes the via portion 160V formed in the second hole 118 and the body portion 160B formed on the via portion 160V. An angle θ6 between bottom and side surfaces of the via portion 160V of the under-bump pattern 160 ranges from 95° to 135°. Top and side surfaces of the under-bump pattern 160 are externally exposed. The side surface of the under-bump pattern 160 does not contact the first insulating layer 101.

In an embodiment, the conductive terminal 400 is formed on the under-bump pattern 160. The formation of the conductive terminal 400 includes performing a solder-ball-attaching process.

Figure 3F:
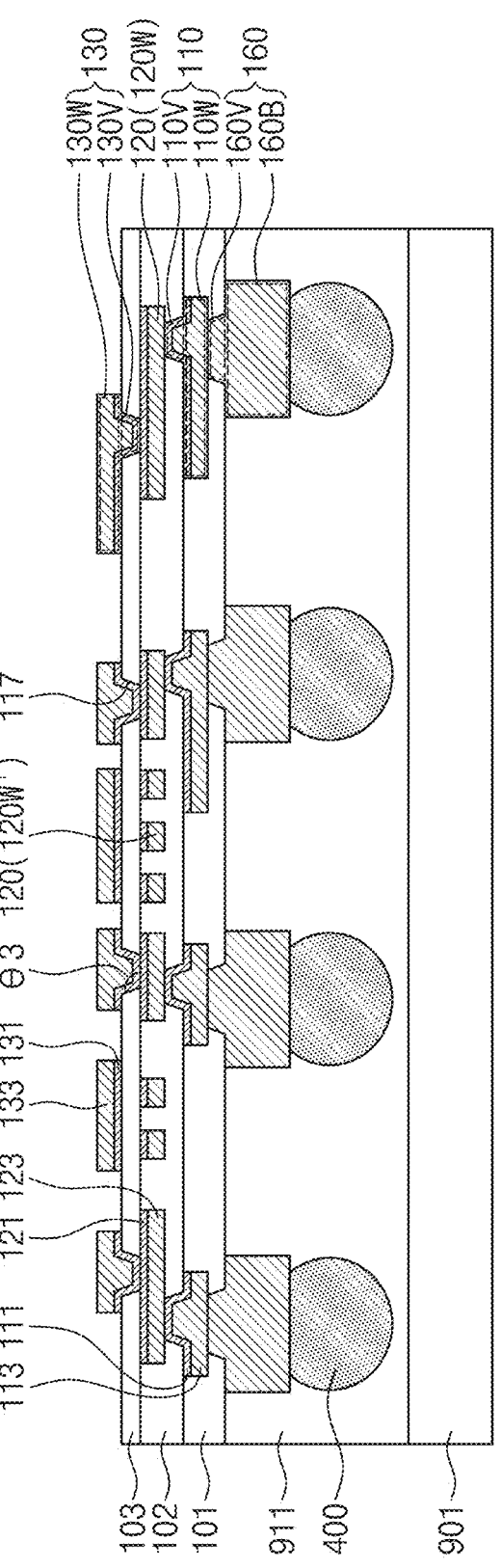

Referring to FIG. 3F, in an embodiment, the semiconductor package is inverted. The inverted semiconductor package is mounted on a second carrier substrate 901. In detail, a second release layer 911 is formed on the second carrier substrate 901, and the semiconductor package is mounted on the second release layer 911. A top surface of the second release layer 911 is in contact with the bottom surface of the first insulating layer 101. The body portion 160B of the under-bump pattern 160 and the conductive terminal 400 is disposed in the second release layer 911.

In an embodiment, the third insulating layer 103 is formed on the second redistribution pattern 120. The third insulating layer 103 is formed by a coating process. The third insulating layer 103 includes, for example, a photosensitive polymer. The third insulating layer 103 covers the top surface of the second insulating layer 102 and the top surface of the second redistribution pattern 120.

In an embodiment, the third insulating layer 103 is patterned to form a third hole 117. The patterning of the third insulating layer 103 is performed by an exposure process and a developing process. The third hole 117 has a tapered shape. For example, a diameter of an upper portion of the third hole 117 is greater than a diameter of a lower portion of the third hole 117. The third hole 117 exposes the top surface of the second redistribution pattern 120. An angle between bottom and side surfaces of the third hole 117 is an obtuse angle. For example, the angle between the bottom and side surfaces of the third hole 117 ranges from 95° to 135°.

In an embodiment, the third redistribution pattern 130 is formed on the second redistribution pattern 120. The third redistribution pattern 130 fills the third hole 117. The forming of the third redistribution pattern 130 is performed by the same method as that for the second redistribution pattern 120. For example, the formation of the third redistribution pattern 130 includes forming a third seed layer that covers the top surface of the third insulating layer 103 and the third hole 117, forming a third resist pattern that has a third opening on the third seed layer, forming a third conductive layer in the third opening, removing the third resist pattern to expose a portion of the third seed layer, and etching the exposed portion of the third seed layer to form the third seed patterns 131. As a result of the etching process, the third conductive pattern 133 is formed from the third conductive layer.

In an embodiment, the third redistribution pattern 130 includes the third seed pattern 131 and the third conductive pattern 133. The third redistribution pattern 130 includes the second via portion 130V and the third wire portion 130W. The second via portion 130V is a portion of the third redistribution pattern 130 formed in the third hole 117. The third wire portion 130W is formed on the second via portion 130V. The third wire portion 130W is formed on the top surface of the third insulating layer 103. An angle θ3 between bottom and side surfaces of the second via portion 130V ranges from 95° to 135°.

Figure 3G:
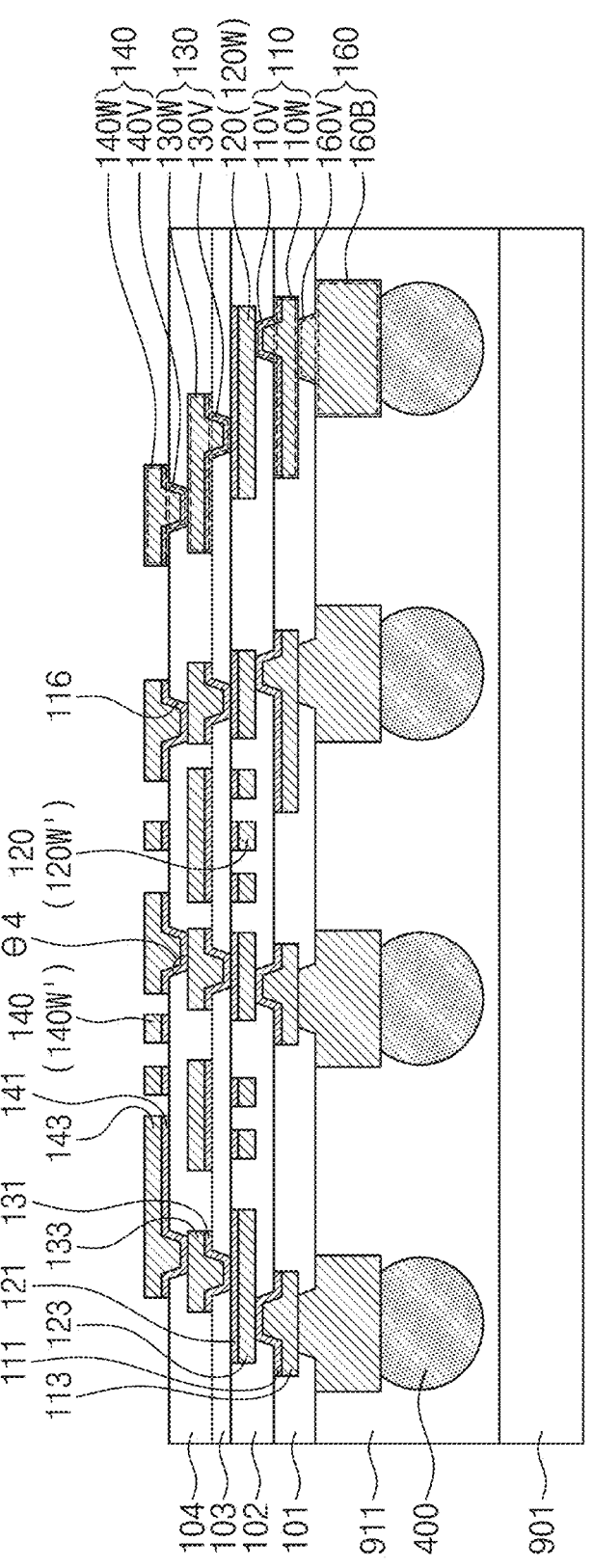

Referring to FIG. 3G, in an embodiment, the fourth insulating layer 104 is formed on the third redistribution pattern 130. The fourth insulating layer 104 is formed by a coating process. The fourth insulating layer 104 includes, for example, a photosensitive polymer. The fourth insulating layer 104 covers the top surface of the third insulating layer 103 and the top and side surfaces of the third wire portion 130W.

In an embodiment, the fourth insulating layer 104 is patterned to form a fourth hole 116. The patterning of the fourth insulating layer 104 is performed through an exposure process and a developing process. The fourth hole 116 has a tapered shape. For example, a diameter of an upper portion of the fourth hole 116 is greater than a diameter of a lower portion of the fourth hole 116. The fourth hole 116 exposes a top surface of the third redistribution pattern 130. An angle between bottom and side surfaces of the fourth hole 116 is an obtuse angle. For example, the angle between the bottom and side surfaces of the fourth hole 116 ranges from 95° to 135°.

In an embodiment, the fourth redistribution pattern 140 is formed on the third redistribution pattern 130. The fourth redistribution pattern 140 fills the fourth hole 116. The formation of the fourth redistribution pattern 140 is performed by the same method as that for the second redistribution pattern 120. For example, the formation of the fourth redistribution pattern 140 includes forming a fourth seed layer that covers the fourth insulating layer 104 and the fourth hole 116, forming a fourth resist pattern that has a fourth opening on the fourth seed layer, forming a fourth conductive layer in the fourth opening, removing the fourth resist pattern to expose a portion of the fourth seed layer, and etching the exposed portion of the fourth seed layer to form the fourth seed patterns 141. As a result of the etching process, the fourth conductive pattern 143 is formed from the fourth conductive layer.

In an embodiment, the fourth redistribution pattern 140 includes the fourth seed pattern 141 and the fourth conductive pattern 143. The fourth redistribution pattern 140 includes the third via portion 140V and the fourth wire portion 140W. The third via portion 140V is formed in the fourth hole 116. The fourth wire portion 140W is formed on the third via portion 140V. The fourth wire portion 140W is formed on the top surface of the fourth insulating layer 104. An angle θ4 between bottom and side surfaces of the third via portion 140V ranges from 95° to 135°.

In an embodiment, the fourth redistribution pattern 140 further includes the second fine wire patterns 140W'. A width of the second fine wire patterns 140W' is less than a width of the fourth wire portion 140W. An angle between bottom and side surfaces of the second fine wire patterns 140W' ranges from 85° to 95°.

Figure 3H:
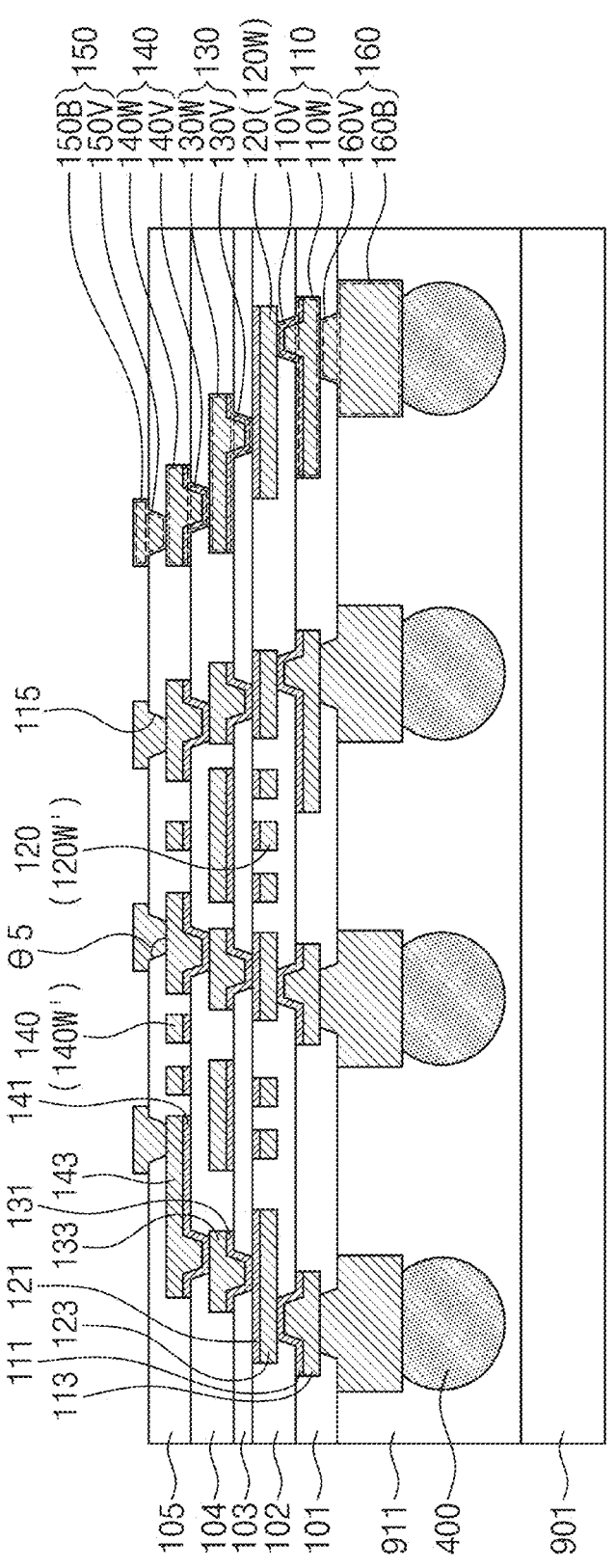

Referring to FIG. 3H, in an embodiment, the fifth insulating layer 105 is formed on the fourth redistribution pattern 140. The fifth insulating layer 105 is formed by a coating process. The fifth insulating layer 105 is formed of or includes, for example, a photosensitive polymer. The fifth insulating layer 105 covers the top surface of the fourth insulating layer 104 and the top and side surfaces of the fourth wire portion 140W.

In an embodiment, the fifth insulating layer 105 is patterned to form a fifth hole 115. The patterning of the fifth insulating layer 105 is performed using an exposure process and a developing process. The fifth hole 115 has a tapered shape. For example, a diameter of an upper portion of the fifth hole 115 is greater than a diameter of a lower portion of the fifth hole 115. The fifth hole 115 exposes the top surface of the fourth redistribution pattern 140. An angle between bottom and side surfaces of the fifth hole 115 is an obtuse angle. For example, the angle between the bottom and side surfaces of the fifth hole 115 ranges from 95° to 135°.

In an embodiment, the bonding pad 150 is formed on the fourth redistribution pattern 140. The bonding pad 150 fills the fifth hole 115. The bonding pad 150 includes the via portion 150V formed in the fifth hole 115, and the body portion 150B formed on the via portion 150V. An angle θ5 between bottom and side surfaces of the via portion 150V of the bonding pad 150 ranges from 95° to 135°. The top and side surfaces of the body portion 150B of the bonding pad 150 are externally exposed. As the bonding pad 150 is formed, the fabrication of the redistribution substrate 100 is finished.

Referring back to FIG. 1, in an embodiment, the second carrier substrate 901 and the second release layer 911 are removed. Accordingly, the bottom surface 100b of the redistribution substrate 100 is exposed. The semiconductor chip 200 is disposed on the redistribution substrate 100 such that the chip pad 205 of the semiconductor chip 200 faces the redistribution substrate 100. The bonding terminal 250 are formed between the bonding pad 150 and the chip pad 205.

In an embodiment, the mold layer 300 is formed on the redistribution substrate 100 and covers the semiconductor chip 200. The mold layer 300 extends into a gap region between the semiconductor chip 200 and the redistribution substrate 100 and seals or encapsulates the bonding terminal 250. Alternatively, an under-fill layer is formed in the gap region that seals or encapsulates the bonding terminal 250.

Figure 4:
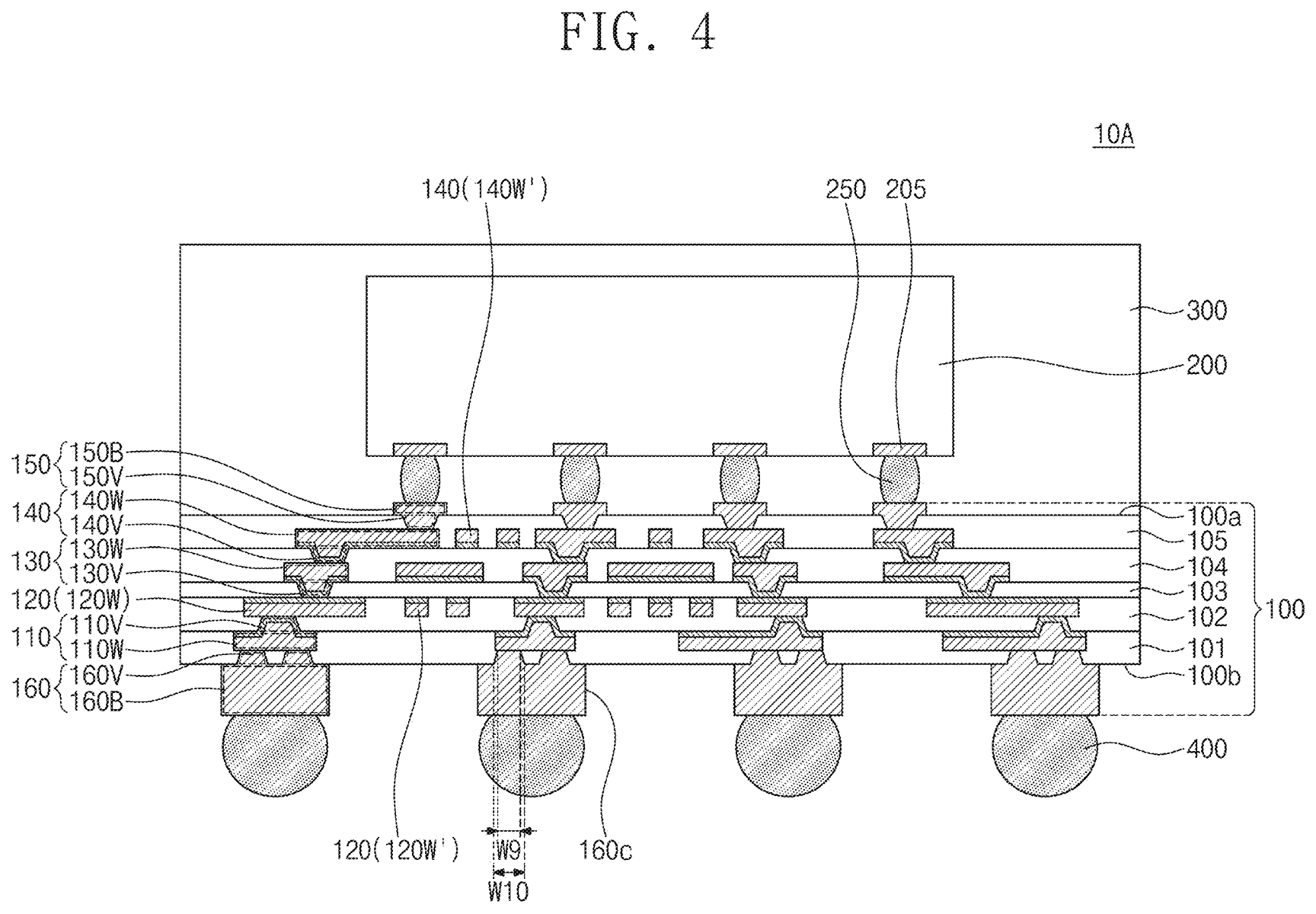

FIG. 4 is a sectional view of a semiconductor package according to an embodiment of the inventive concept. For concise description, a previously described element may be identified by the same reference number without repeating an overlapping description thereof.

Referring to FIG. 4, in an embodiment, the under-bump pattern 160 of the semiconductor package 10A includes a plurality of via portions 160V. For example, the under-bump pattern 160 includes a pair of via portions 160V. Adjacent via portions 160V are spaced apart from each other by the first insulating layer 101. The smallest width of each of the via portions 160V is the ninth width W9, and the largest width thereof is the tenth width W10. A width of each of the via portions 160V is substantially equal to the width of the first via portion 110V. For example, referring to FIG. 2, the ninth width W9 is substantially equal to the second width W2, and the tenth width W10 is substantially equal to the first width W1. Alternatively, the width of each of the via portions 160V is less than the width of the first via portion 110V. In other words, the ninth width W9 is smaller than the second width W2, and the tenth width W10 is smaller than the first width W1. In an embodiment, the width of each of the via portions 160V is greater than the width of the first via portion 110V, as described with reference to FIGS. 1 and 2.

Figure 5:
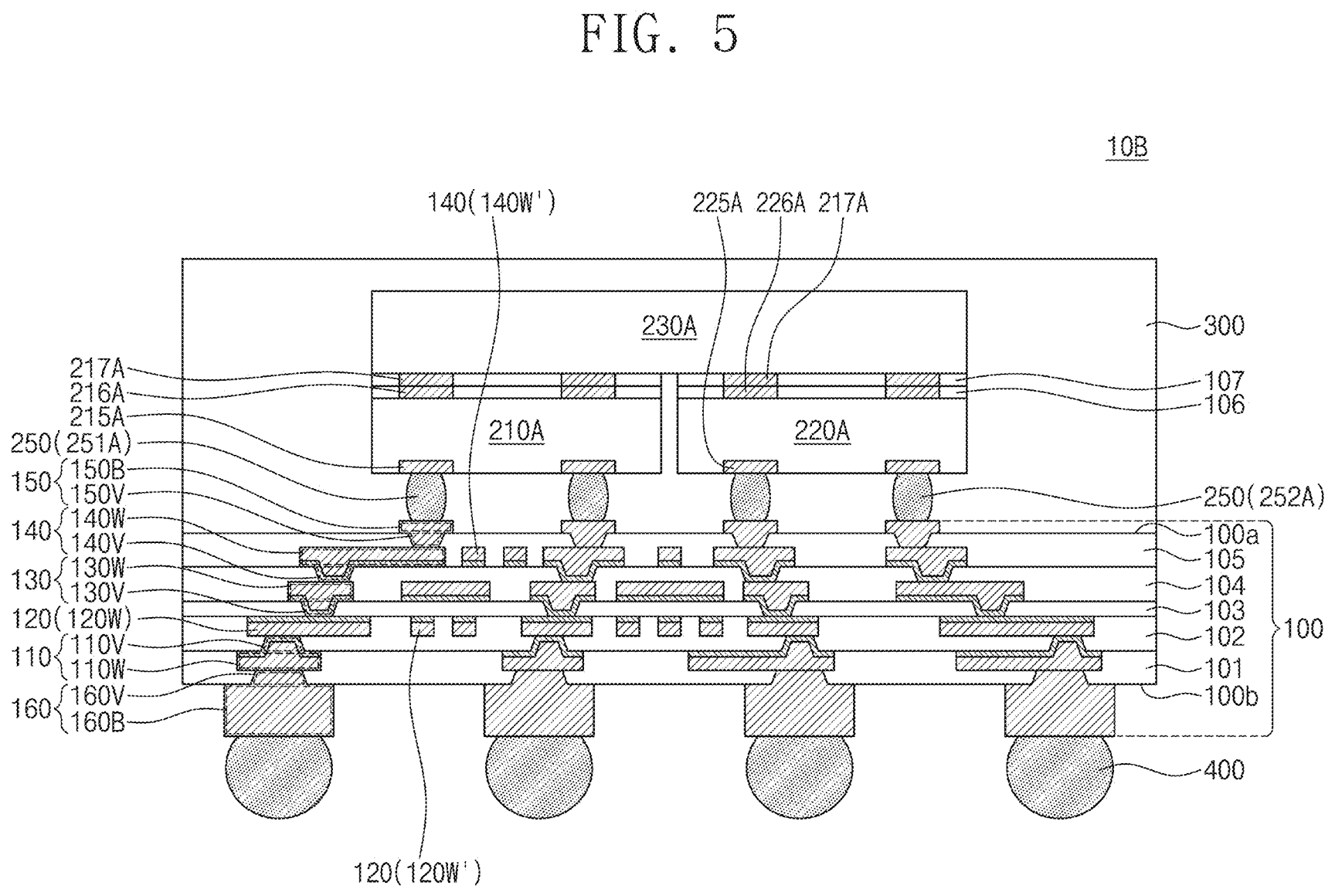

FIG. 5 is a sectional view of a semiconductor package according to an embodiment of the inventive concept. For concise description, a previously described element may be identified by the same reference number without repeating an overlapping description thereof.

Referring to FIG. 5, in an embodiment, a first semiconductor chip 210A, a second semiconductor chip 220A, and a third semiconductor chip 230A are mounted on the redistribution substrate 100 of the semiconductor package 10B. Each of the first to third semiconductor chips 210A, 220A, and 230A is one of a logic chip, a memory chip, a buffer chip, or a system-on-chip (SOC).

In an embodiment, the first semiconductor chip 210A includes a first chip pad 215A. The first chip pad 215A is externally exposed by the first semiconductor chip 210A near a bottom surface of the first semiconductor chip 210A. The second semiconductor chip 220A includes a second chip pad 225A. The second chip pad 225A is externally exposed by the second semiconductor chip 220A near a bottom surface of the second semiconductor chip 220A.

In an embodiment, the bonding terminals 250 include a first bonding terminal 251A and a second bonding terminal 252A. The first bonding terminal 251A is interposed between the bonding pad 150 and the first chip pad 215A. The second bonding terminal 252A is interposed between the bonding pad 150 and the second chip pad 225A.

In an embodiment, the first semiconductor chip 210A and the second semiconductor chip 220A are located at substantially the same level. The third semiconductor chip 230A is mounted on the first and second semiconductor chips 210A and 220A. The first and second semiconductor chips 210A and 220A vertically overlap the third semiconductor chip 230A. A sixth insulating layer 106 and a seventh insulating layer 107 are sequentially interposed between the first semiconductor chip 210A and the third semiconductor chip 230A and between the second semiconductor chip 220A and the third semiconductor chip 230A. Each of the sixth and seventh insulating layers 106 and 107 includes, for example, a photosensitive polymer.

In an embodiment, a first upper connection pad 216A and a second upper connection pad 226A are disposed in the sixth insulating layer 106. The first upper connection pad 216A is disposed on the first semiconductor chip 210A. A bottom surface of the first upper connection pad 216A is in contact with the first semiconductor chip 210A. The second upper connection pad 226A is disposed on the second semiconductor chip 220A. A bottom surface of the second upper connection pad 226A is in contact with the second semiconductor chip 220A.

In an embodiment, lower connection pads 217A are disposed in the seventh insulating layer 107. The lower connection pads 217A are disposed on a bottom surface of the third semiconductor chip 230A. The lower connection pads 217A are disposed at positions that correspond to the first upper connection pad 216A or the second upper connection pad 226A. The first and second upper connection pads 216A and 226A and the lower connection pads 217A are formed of or include at least one conductive materials.

In an embodiment, the lower connection pad 217A is directly bonded to the first upper connection pad 216A. A bottom surface of the lower connection pad 217A is in contact with a top surface of the first upper connection pad 216A. The lower connection pad 217A is directly bonded to the second upper connection pad 226A. A bottom surface of the lower connection pad 217A is in contact with a top surface of the second upper connection pad 226A. In an embodiment, the lower connection pad 217A and the first upper connection pad 216A are connected to each other in a hybrid bonding manner, and the lower connection pad 217A and the second upper connection pad 226A are connected to each other in a hybrid bonding manner.

In an embodiment, the mold layer 300 is disposed on the redistribution substrate 100 and covers the side surface of the first semiconductor chip 210A, the side surface of the second semiconductor chip 220A, and the top and side surfaces of the third semiconductor chip 230A. The mold layer 300 extends into a first gap region between the first semiconductor chip 210A and the redistribution substrate 100 and a second gap region between the second semiconductor chip 220A and the redistribution substrate 100 and seals or encapsulates the first and second bonding terminals 251A and 252A. The mold layer 300 extends into a region between the first and second semiconductor chips 210A and 220A.

Figure 6:
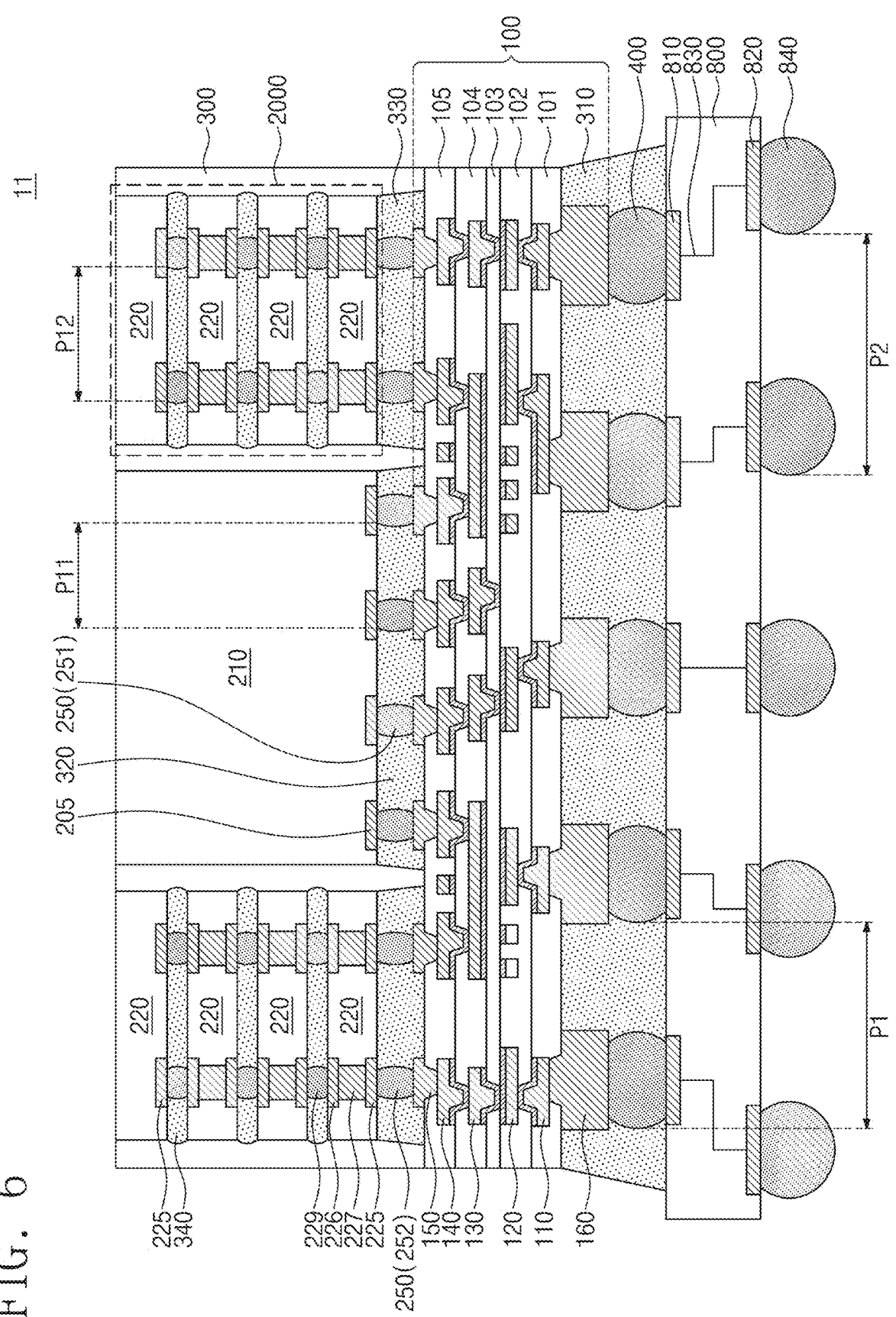
FIG. 6 is a sectional view of a semiconductor package according to an embodiment of the inventive concept.

FIG. 6 is a sectional view of a semiconductor package according to an embodiment of the inventive concept. For concise description, a previously described element may be identified by the same reference number without repeating an overlapping description thereof.

Referring to FIG. 6, in an embodiment, a semiconductor package 11 includes a package substrate 800, a redistribution substrate 100, a conductive terminal 400, a first semiconductor chip 210, a chip stack 2000, and a mold layer 300. The conductive terminal 400 and the mold layer 300 have substantially the same features as those described with reference to FIG. 1. The bonding terminals 250 include a first bonding terminal 251 and a second bonding terminal 252.

In an embodiment, the package substrate 800 includes a printed circuit board. The package substrate 800 includes an upper metal pad 810, a lower metal pad 820, and a wire 830. The wire 830 is disposed in the package substrate 800. The upper metal pad 810 is disposed on a top surface of the package substrate 800 and is connected to a first end of the wire 830. Outer coupling terminals 840 are provided on a bottom surface of the package substrate 800 and are connected to the lower metal pads 820. The lower metal pad 820 is connected to a second end of the wire 830, opposite to the first end. Externally received electric signals are transmitted to the redistribution substrate 100, the first semiconductor chip 210, and the chip stack 2000 through the outer coupling terminals 840. In an embodiment, solder balls are provided as the outer coupling terminals 840. The outer coupling terminals 840 are formed of or include at least one metal, such as a soldering material.

In an embodiment, the redistribution substrate 100 is disposed on the package substrate 800. The redistribution substrate 100 is an interposer substrate. The conductive terminal 400 is aligned and coupled to the upper metal pad 810 of the package substrate 800. The redistribution substrate 100 is electrically connected to the package substrate 800 through the conductive terminal 400. The redistribution substrate 100 has substantially the same features as those described with reference to FIGS. 1 and 2.

In an embodiment, a first under-fill layer 310 is disposed between the redistribution substrate 100 and the package substrate 800. The first under-fill layer 310 seals or encapsulates the body portion 160B of the under-bump pattern 160 and the conductive terminal 400. The first under-fill layer 310 includes an insulating polymer, such as an epoxy-based polymer. In an embodiment, the first under-fill layer 310 is omitted.

In an embodiment, the first semiconductor chip 210 is mounted on the top surface of the redistribution substrate 100. For example, the first bonding terminal 251 is interposed between the chip pad 205 of the first semiconductor chip 210 and the bonding pad 150. The first semiconductor chip 210 has substantially the same features as the semiconductor chip 200 described with reference to FIG. 1, and the arrangement relationship, function, and material of the first bonding terminal 251 are substantially the same as those of the bonding terminal 250 described with reference to FIG. 1.

In an embodiment, a plurality of the first bonding terminals 251 are provided. A pitch P11 of the first bonding terminals 251 is less than a pitch P1 of the conductive terminals 400. The pitch P11 of the first bonding terminals 251 is less than a pitch P2 of the outer coupling terminals 840.

In an embodiment, the chip stack 2000 is mounted on the top surface of the redistribution substrate 100. The chip stack 2000 is laterally spaced apart from the first semiconductor chip 210. The chip stack 2000 includes a plurality of second semiconductor chips 220 that are vertically stacked. Adjacent second semiconductor chips 220 are separated from each other by a fourth under-fill layer 340. Each of the second semiconductor chips 220 has the same or similar features as the semiconductor chip 200 described with reference to FIG. 1. However, the second semiconductor chips 220 is a different type from the first semiconductor chip 210. For example, the first semiconductor chip 210 may be one of a logic chip, a memory chip, a buffer chip, or a system-on-chip (SOC), and the second semiconductor chip 220 may be another of a logic chip, a memory chip, a buffer chip, or a system-on-chip (SOC). In the present specification, a memory chip is a high bandwidth memory (HBM) chip. For example, the first semiconductor chip 210 is a logic chip, and the second semiconductor chips 220 is an HBM chip. For another example, the lowermost second semiconductor chip 220 is a logic chip, and the others are HBM chips.

In an embodiment, each of the second semiconductor chips 220 includes a lower pad 225, a penetration electrode 227, and an upper pad 226. The lower pad 225 and the upper pad 226 are disposed on bottom and top surfaces, respectively, of the second semiconductor chip 220. At least one of the lower and upper pads 225 and 226 is electrically connected to the integrated circuits of the second semiconductor chip 220. The penetration electrode 227 is disposed in the second semiconductor chip 220 and is coupled to the lower pad 225 and the upper pad 226. The uppermost second semiconductor chip 220 includes the lower pad 225 but not the penetration electrode 227 and the upper pad 226. Alternatively, in an embodiment, the uppermost second semiconductor chips 220 further includes the penetration electrode 227 and the upper pad 226. An interposer terminal 229 is interposed between adjacent second semiconductor chips 220, penetrates the fourth under-fill layer 340, and is coupled to the lower pad 225 and the upper pad 226. Thus, the second semiconductor chips 220 are electrically connected to each other. The interposer terminal 229 includes a solder pillar or a solder bump. The interposer terminal 229 is formed of or includes a soldering material, but embodiments of the inventive concept are not limited thereto. In an embodiment, the interposer terminal 229 is omitted. In this case, adjacent second semiconductor chips 220 are connected to each other so that facing pads thereof, such as the lower and upper pads 225 and 226, are directly bonded to each other.

In an embodiment, the second bonding terminal 252 is interposed between the lowermost second semiconductor chips 220 and the redistribution substrate 100 and is coupled to the lower pad 225 and a corresponding bonding pad 150. Thus, the second semiconductor chips 220 are electrically connected to the first semiconductor chip 210 and the conductive terminal 400 through the redistribution substrate 100. The arrangement relationship, function, and material of the second bonding terminal 252 is substantially the same as those of the bonding terminal 250 described with reference to FIG. 1. A pitch P12 of the second bonding terminals 252 is less than the pitch P1 of the conductive terminals 400 and the pitch P2 of the outer coupling terminals 840.

In an embodiment, a plurality of the chip stacks 2000 are provided. The chip stacks 2000 are laterally spaced apart from each other. The first semiconductor chip 210 is disposed between the chip stacks 2000. In this case, a length of an electrical conduction path between the first semiconductor chip 210 and the chip stacks 2000 is reduced.

In an embodiment, a second under-fill layer 320 is disposed in a first gap region between the redistribution substrate 100 and the first semiconductor chip 210 and seals or encapsulates the first bonding terminal 251. The second under-fill layer 320 includes an insulating polymer, such as an epoxy-based polymer. A third under-fill layer 330 is disposed in each of second gap regions between the redistribution substrate 100 and the chip stacks 2000 and seals or encapsulates a corresponding second bonding terminals 252. The third under-fill layer 330 includes an insulating polymer, such as an epoxy-based polymer. Alternatively, in an embodiment, a single under-fill layer is provided between the first gap region and the second gap regions that seals or encapsulates the first bonding terminal 251 and the second bonding terminal 252. The fourth under-fill layer 340 is disposed between the second semiconductor chips 220 and seals or encapsulates the interposer terminal 229. The fourth under-fill layer 340 includes an insulating polymer, such as an epoxy-based polymer.

In an embodiment, the mold layer 300 is disposed on the redistribution substrate 100 and covers the side surface of the first semiconductor chip 210 and the side surfaces of the second semiconductor chips 220. The mold layer 300 exposes the top surface of the first semiconductor chip 210 and the top surface of the uppermost second semiconductor chip 220. Alternatively, in an embodiment, the mold layer 300 covers the top surface of the first semiconductor chip 210 and the top surface of the uppermost second semiconductor chip 220. In another embodiment, the second under-fill layer 320 and the third under-fill layer 330 are omitted, and the mold layer 300 extends into the first gap region and the second gap regions.

In addition, in an embodiment, a conductive plate is additionally disposed on the top surface of the first semiconductor chip 210, the top surface of the chip stack 2000, and the top surface of the mold layer 300. The conductive plate covers at least a portion of the side surface of the mold layer 300. The conductive plate protects the first semiconductor chip 210 and the chip stack 2000 from the outside. For example, the conductive plate prevents an impurity contamination or absorbs a physical impact. The conductive plate is formed of or includes a thermally conductive material, and in this case, the conductive plate is used as a heat sink or a heat slug, or a heat spreader. For example, the conductive plate can quickly exhaust heat that is produced by the redistribution substrate 100, the first semiconductor chip 210, or the second semiconductor chips 220 during operations of the semiconductor package. Since the conductive plate conducts electricity, it can be used as an electromagnetic wave shielding layer. In this case, the conductive plate can prevent electromagnetic interference (EMI) from occurring between the first semiconductor chip 210 and the second semiconductor chips 220. The conductive plate is grounded through the redistribution substrate 100, and in this case, it can prevent the first semiconductor chip 210 or the second semiconductor chips 220 from being damaged by an electrostatic discharge (ESD).

In addition, in an embodiment, a third semiconductor chip is additionally mounted on the redistribution substrate 100. The third semiconductor chip is a different type from the first and second semiconductor chips 210 and 220.

Figure 7:
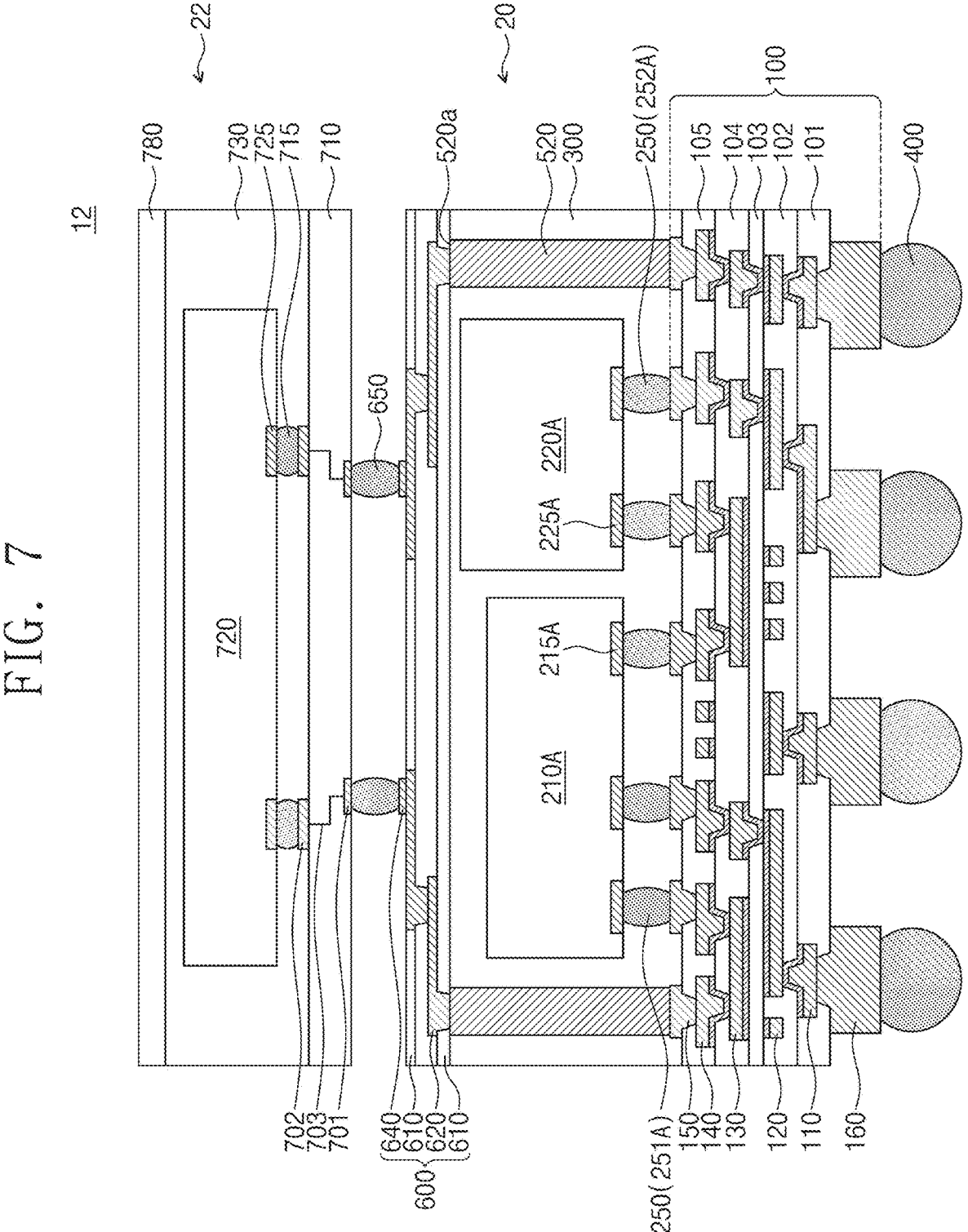
FIG. 7 is a sectional view of a semiconductor package according to an embodiment of the inventive concept.

FIG. 7 is a sectional view of a semiconductor package according to an embodiment of the inventive concept. For concise description, a previously described element may be identified by the same reference number without repeating an overlapping description thereof.

Referring to FIG. 7, in an embodiment, a semiconductor package 12 includes a lower semiconductor package 20 and an upper semiconductor package 22. The lower semiconductor package 20 includes a redistribution substrate 100, a conductive terminal 400, bonding terminals 250, a first semiconductor chip 210A, a second semiconductor chip 220A, a mold layer 300, and a conductive structure 520. The redistribution substrate 100, the conductive terminal 400, and the mold layer 300 have substantially the same features as those described with reference to FIG. 1.

In an embodiment, the second semiconductor chip 220A is laterally spaced apart from the first semiconductor chip 210A. The second semiconductor chip 220A is a different kind of semiconductor chip from the first semiconductor chip 210A. For example, the first semiconductor chip 210A is one of a logic chip, a memory chip, or a power management chip, and the second semiconductor chip 220A is another of a logic chip, a memory chip, or a power management chip. The logic chip may be an application specific integrated circuit (ASIC) chip or an application processor (AP) chip. The ASIC chip includes an application specific integrated circuit (ASIC). The power management chip includes a power management integrated circuit (PMIC). In an embodiment, the first semiconductor chip 210A is an ASIC chip, and the second semiconductor chip 220A is a power management chip. Each of the first and second semiconductor chips 210A and 220A has features similar to the semiconductor chip 200 described with reference to FIG. 1. Alternatively, in an embodiment, the second semiconductor chip 220A is omitted. In an embodiment, a third semiconductor chip is further mounted on the top surface of the redistribution substrate 100.

In an embodiment, the bonding terminals 250 include the first bonding terminals 251A and second bonding terminals 252A. Each of the first bonding terminals 251A are similar to the first bonding terminal 251 described with reference to FIG. 6, and each of the second bonding terminals 252A are similar to the second bonding terminal 252 described with reference to FIG. 6. The chip pads 215A of the first semiconductor chip 210A are electrically connected to the redistribution substrate 100 through the first bonding terminals 251A. The chip pads 225A of the second semiconductor chip 220A are electrically connected to the redistribution substrate 100 through the second bonding terminals 252A. Thus, the second semiconductor chip 220A is electrically connected to the first semiconductor chip 210A through the redistribution substrate 100.

In an embodiment, the conductive structure 520 is disposed on the top surface of the redistribution substrate 100 and is coupled to a corresponding bonding pad 150. The conductive structure 520 is laterally spaced apart from the first and second semiconductor chips 210A and 220A. The conductive structure 520 is disposed on an edge region of the redistribution substrate 100, when viewed in a plan view. A metal pillar that serves as the conductive structure 520 is disposed on the redistribution substrate 100. That is, the conductive structure 520 is a metal pillar. The conductive structure 520 is electrically connected to the redistribution substrate 100. For example, the conductive structure 520 is electrically connected to the first semiconductor chip 210A, the second semiconductor chip 220A, or the conductive terminal 400 through the redistribution substrate 100. The conductive structure 520 is formed of or includes at least one metal, such as copper.

In an embodiment, the mold layer 300 is disposed on the top surface of the redistribution substrate 100 and covers the first and second semiconductor chips 210A and 220A. The mold layer 300 seals or encapsulates the side surfaces of the conductive structure 520. The mold layer 300 is disposed between the first and second semiconductor chips 210A and 220A, between the first semiconductor chip 210A and the conductive structure 520, and between the second semiconductor chip 220A and the conductive structure 520. The mold layer 300 exposes a top surface 520a of the conductive structure 520.

In an embodiment, the lower semiconductor package 20 further includes an upper re-distribution layer 600. The upper re-distribution layer 600 is disposed on the top surface of the mold layer 300. The upper re-distribution layer 600 includes upper insulating patterns 610, upper redistribution patterns 620, and an upper bonding pad 640. The upper insulating patterns 610 are stacked on the mold layer 300. The upper insulating patterns 610 include a photosensitive polymer. Each of the upper redistribution patterns 620 includes a via portion in the upper insulating pattern 610 and a wire portion between the upper insulating patterns 610. The upper redistribution patterns 620 are formed of or include at least one metal, such as copper. At least one of the upper redistribution patterns 620 is in contact with the top surface 520a of the conductive structure 520. Thus, the upper redistribution patterns 620 are coupled to the conductive structure 520. The upper bonding pad 640 is disposed on the uppermost upper insulating pattern 610 and is coupled to the upper redistribution patterns 620. The upper bonding pad 640 is electrically connected to the conductive terminal 400, the first semiconductor chip 210A, or the second semiconductor chip 220A through the upper redistribution patterns 620 and the conductive structure 520. Since the upper redistribution patterns 620 are provided, the upper bonding pad 640 need not be vertically aligned with the conductive structure 520.

In an embodiment, the upper semiconductor package 22 is disposed on the lower semiconductor package 20. For example, the upper semiconductor package 22 is disposed on the upper re-distribution layer 600. The upper semiconductor package 22 includes an upper substrate 710, an upper semiconductor chip 720, and an upper mold layer 730. The upper substrate 710 may be a printed circuit board. Alternatively, the upper substrate 710 may be a redistribution layer. For example, the upper substrate 710 is manufactured in the same manner as the redistribution substrate 100 described with reference to FIGS. 3A to 3H. A first connection pad 701 and a second connection pad 702 are disposed on bottom and top surfaces, respectively, of the upper substrate 710. A wire 703 is disposed in the upper substrate 710 and is coupled to the first connection pad 701 and the second connection pad 702. The wire 703 is schematically illustrated in FIG. 7, but the shape and arrangement of the wire 703 can vary. The first connection pad 701, the second connection pad 702, and the wire 703 are formed of or include a conductive material, such as a metal.

In an embodiment, the upper semiconductor chip 720 is disposed on the upper substrate 710. The upper semiconductor chip 720 includes integrated circuits, and in an embodiment, the integrated circuits may include a memory circuit, a logic circuit, or combinations thereof. The upper semiconductor chip 720 is a different type of semiconductor chip from the first and second semiconductor chips 210A and 220A. For example, the upper semiconductor chip 720 is a memory chip. A bump terminal 715 is interposed between the upper substrate 710 and the upper semiconductor chip 720 and is coupled to the second connection pad 702 and a chip pad 725 of the upper semiconductor chip 720. The upper semiconductor chip 720 is electrically connected to the first connection pad 701 through the bump terminal 715 and a wire 703. Alternatively, in an embodiment, the bump terminal 715 is omitted, and the chip pad 725 is directly coupled to the second connection pad 702.

In an embodiment, the upper mold layer 730 is disposed on the upper substrate 710 and covers the upper semiconductor chip 720. The upper mold layer 730 is formed of or includes an insulating polymer, such as an epoxy-based polymer.

In an embodiment, the upper semiconductor package 22 further includes a heat dissipation structure 780. The heat dissipation structure 780 may be a heat sink, a heat slug, or a thermal interface material (TIM) layer. For example, the heat dissipation structure 780 is formed of or includes at least one metal. The heat dissipation structure 780 is disposed on a top surface of the upper mold layer 730. The heat dissipation structure 780 covers at least a portion of a side surface of the upper mold layer 730 or at least a portion of a side surface of the mold layer 300.

In an embodiment, the semiconductor package 12 further includes a connection terminal 650. The connection terminal 650 is interposed between the upper bonding pad 640 and the first connection pad 701 and is coupled to the upper bonding pad 640 and the first connection pad 701. Thus, the upper semiconductor package 22 is electrically connected to the first semiconductor chip 210A, the second semiconductor chip 220A, and the conductive terminal 400 through the connection terminal 650. In a present embodiment, the electric connection with the upper semiconductor package 22 includes an electric connection with integrated circuits in the upper semiconductor chip 720.

In an embodiment, the upper substrate 710 is omitted, and the connection terminal 650 is directly coupled to the chip pad 725 of the upper semiconductor chip 720. In this case, the upper mold layer 730 is in direct contact with a top surface of the upper re-distribution layer 600. In an embodiment, the upper substrate 710 and the connection terminal 650 are omitted, and the chip pad 725 of the upper semiconductor chip 720 is directly coupled to the upper bonding pad 640.

Figure 8:
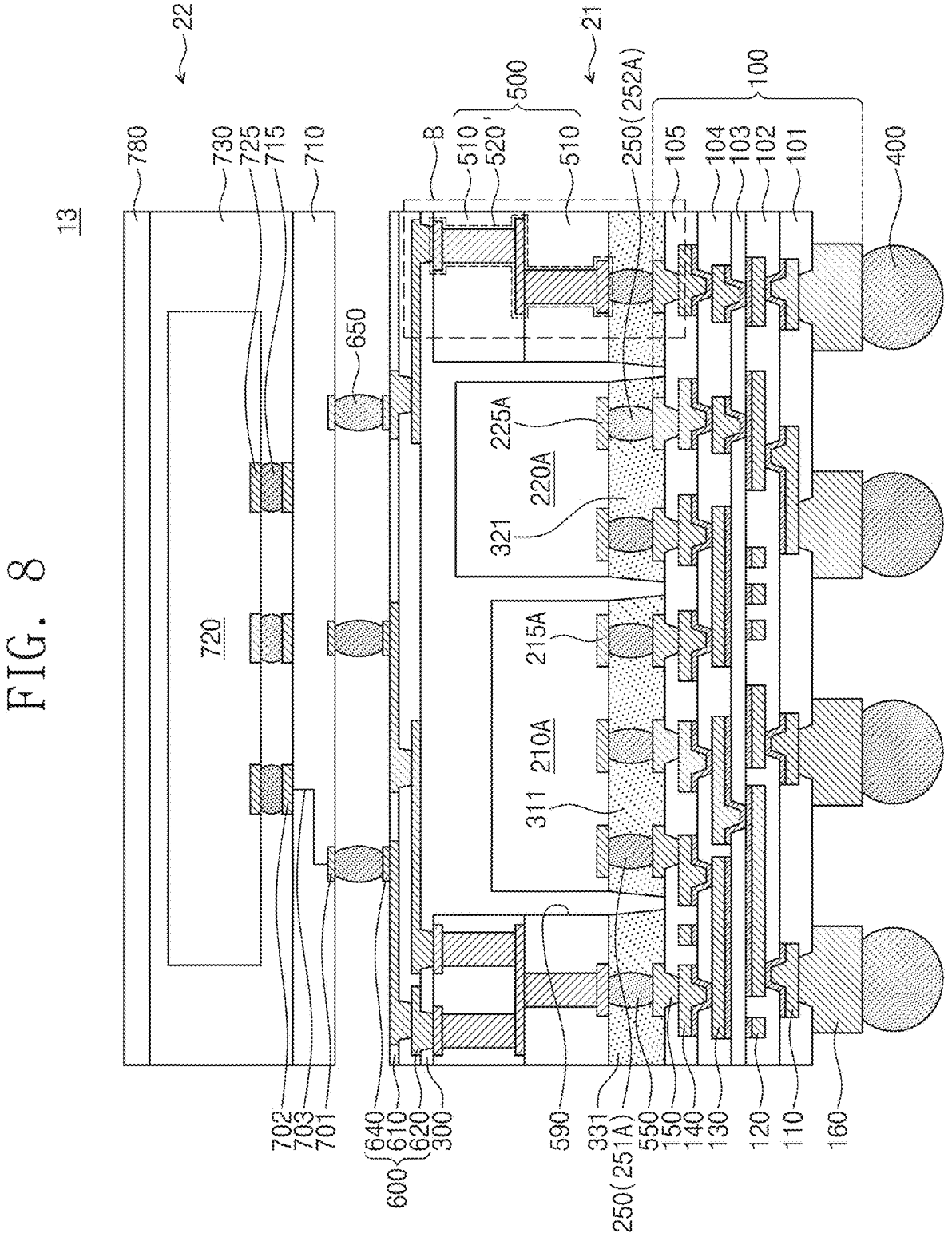
FIG. 8 is a sectional view of a semiconductor package according to an embodiment of the inventive concept.
Figure 9:
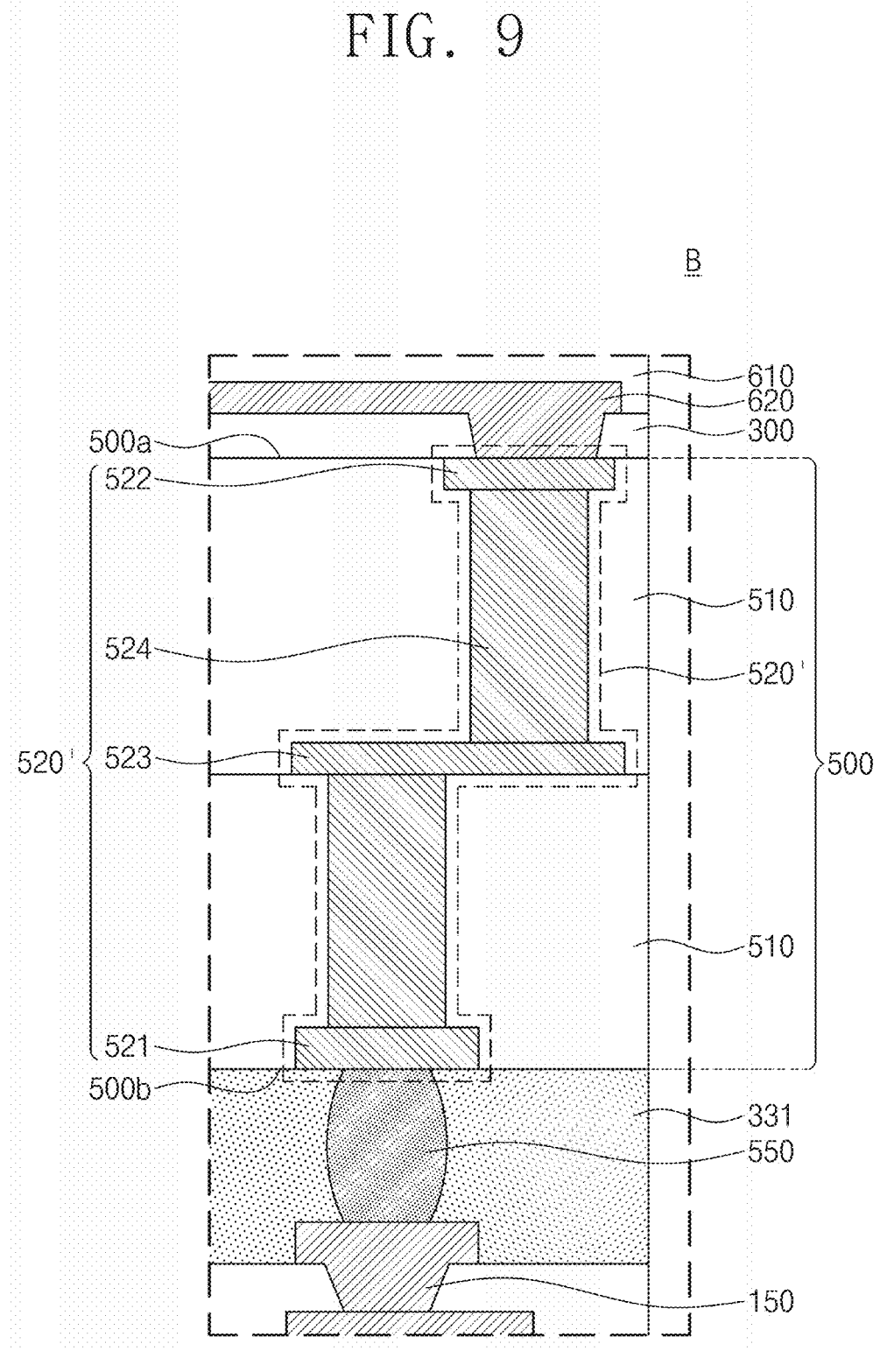
FIG. 9 is an enlarged sectional view of a portion 'B' of FIG. 8.

FIG. 8 is a sectional view of a semiconductor package according to an embodiment of the inventive concept. FIG. 9 is an enlarged sectional view of a portion 'B' of FIG. 8. For concise description, a previously described element may be identified by the same reference number without repeating an overlapping description thereof.

Referring to FIGS. 8 and 9, in an embodiment, a semiconductor package 13 includes a lower semiconductor package 21 and an upper semiconductor package 22. The lower semiconductor package 21 includes a redistribution substrate 100, a conductive terminal 400, bonding terminals 250, a first semiconductor chip 210A, a second semiconductor chip 220A, a mold layer 300, and a connection substrate 500. The redistribution substrate 100, the conductive terminal 400, the bonding terminals 250, the first semiconductor chip 210A, the second semiconductor chip 220A, and the mold layer 300 have substantially the same features as those described with reference to FIG. 1. The first and second semiconductor chips 210A and 220A have substantially the same features as the first and second semiconductor chips 210A and 220A described with reference to FIG. 7. The bonding terminals 250 include the first bonding terminals 251A and the second bonding terminals 252A. The first bonding terminals 251A and the second bonding terminals 252A have substantially the same features as the first bonding terminals 251A and the second bonding terminals 252A described with reference to FIG. 7. A first under-fill layer 311 is disposed in a first gap region between the redistribution substrate 100 and the first semiconductor chip 210A. The first under-fill layer 311 seals or encapsulates the first bonding terminals 251A. A second under-fill layer 321 is disposed in a second gap region between the redistribution substrate 100 and the second semiconductor chip 220A and seals or encapsulates the second bonding terminals 252A.

In an embodiment, the connection substrate 500 is disposed on the redistribution substrate 100. A substrate hole 590 penetrates the connection substrate 500. For example, the connection substrate 500 can be manufactured to have the substrate hole 590 penetrate a printed circuit board from top to bottom. When viewed in a plan view, the substrate hole 590 is formed in a center portion of the redistribution substrate 100. The first and second semiconductor chips 210A and 220A are disposed in the substrate hole 590 of the connection substrate 500. The first and second semiconductor chips 210A and 220A are spaced apart from an inner side surface of the hole 590 of the connection substrate 500.

In an embodiment, the connection substrate 500 includes a base layer 510 and a conductive structure 520'. The base layer 510 may include a plurality of stacked base layers 510. The base layers 510 are formed of or include an insulating material. For example, the base layers 510 are formed of or include at least one of a carbon-based material, a ceramics, or a polymer. The substrate hole 590 penetrates the base layers 510. The conductive structure 520' is disposed in the base layers 510.

In an embodiment, the conductive structure 520' includes a first pad 521, a conductive wire 523, vias 524, and a second pad 522. The first pad 521 is externally exposed in the connection substrate 500 near a bottom surface 500b of the connection substrate 500 and is coupled to a corresponding via 524. The conductive wire 523 is interposed between the base layers 510. The vias 524 penetrate the base layers 510 and are coupled to the conductive wire 523. The second pad 522 is externally exposed in the connection substrate 500 near a top surface 500a of the connection substrate 500 and is coupled to another corresponding via 524. The second pad 522 is electrically connected to the first pad 521 through the vias 524 and the conductive wire 523. The second pad 522 is not vertically aligned to the first pad 521. The number of the second pads 522 may differ from the number of the first pads 521. The conductive structure 520' is formed of or includes at least one metal. For example, the conductive structure 520' is formed of or includes at least one of copper, aluminum, tungsten, titanium, tantalum, or iron, or alloys thereof.

In an embodiment, a connection bump 550 is disposed between the redistribution substrate 100 and the connection substrate 500. The connection bump 550 is interposed between and coupled to a corresponding pair of the first pad 521 and the bonding pad 150. The conductive structure 520' is electrically connected to the redistribution substrate 100 through the connection bump 550. The connection bump 550 includes at least one of a solder ball, a solder bump, or a solder pillar. The connection bump 550 is formed of or includes at least one metal. A third under-fill layer 331 is disposed in a gap region between the redistribution substrate 100 and the connection substrate 500 and seals or encapsulates the connection bump 550. The third under-fill layer 331 includes an insulating polymer.

In an embodiment, the mold layer 300 is disposed on the first semiconductor chip 210A, the second semiconductor chip 220A, and the connection substrate 500. The mold layer 300 is interposed between the first and second semiconductor chips 210A and 220A, between the first semiconductor chip 210A and the connection substrate 500, and between the second semiconductor chip 220A and the connection substrate 500. According to an embodiment of the inventive concept, an adhesive insulating film serving as the mold layer 300 is attached to the top surface of the connection substrate 500, the top surfaces of the first and second semiconductor chips 210A and 220A, and the side surfaces of the first and second semiconductor chips 210A and 220A. For example, an Ajinomoto build-up film (ABF) can be used as the adhesive insulating film. For another example, the mold layer 300 can be formed of or include at least one insulating polymer, such as an epoxy-based polymer. In an embodiment, the first and second under-fill layers 311 and 321 are omitted, and the mold layer 300 further extends to cover at least a portion of the bottom surfaces of the first and second semiconductor chips 210A and 220A. In an embodiment, the third under-fill layer 331 is omitted, and the mold layer 300 further extends into a gap region between the redistribution substrate 100 and the connection substrate 500.

In an embodiment, the lower semiconductor package 21 further includes the upper re-distribution layer 600. The upper re-distribution layer 600 is disposed on the mold layer 300 and the connection substrate 500. The upper re-distribution layer 600 includes the upper insulating patterns 610, the upper redistribution patterns 620, and the upper bonding pad 640. The upper insulating patterns 610, the upper redistribution patterns 620, and the upper bonding pad 640 have substantially the same features as those described with reference to FIG. 7. However, at least one of the upper redistribution patterns 620 extends into the mold layer 300 and is coupled to the second pad 522.

In an embodiment, the upper semiconductor package 22 is disposed on the lower semiconductor package 21. For example, the upper semiconductor package 22 is disposed on the upper re-distribution layer 600. The upper semiconductor package 22 includes the upper substrate 710, the upper semiconductor chip 720, and the upper mold layer 730. The upper semiconductor package 22 and the connection terminal 650 have substantially the same features as those described with reference to FIG. 7. For example, the connection terminal 650 is interposed between the lower semiconductor package 21 and the upper semiconductor package 22. The upper semiconductor package 22 further includes the heat dissipation structure 780.

According to an embodiment of the inventive concept, a second redistribution pattern that includes fine wire patterns is formed in advance before an under-bump pattern is formed. Accordingly, an undulation phenomenon of the fine wire patterns can be suppressed, which can occur when an insulating layer between the under-bump patterns shrinks during the fabrication process, and uniformity in the line width can be secured. As a result, the reliability of the semiconductor package can be improved.

According to an embodiment of the inventive concept, the under-bump pattern has a relatively large thickness. In this case, the electrical characteristics of the semiconductor package can be improved.

While embodiments of the inventive concept have been particularly shown and described, it will be understood by one of ordinary skill in the art that variations in form and detail may be made therein without departing from the spirit and scope of the attached claims.

What is claimed is:

1. A method of manufacturing a semiconductor package, the method comprising:
   forming a first redistribution pattern, a second redistribution pattern and an under-bump pattern on a first carrier substrate,
   inverting the semiconductor package;
   forming a first release layer on a second carrier substrate; and
   mounting the inverted semiconductor package in the first release layer,
   wherein the first redistribution pattern is formed after forming the second redistribution pattern,
   wherein the second redistribution pattern includes a first wire portion and first fine wire patterns,
   a width of the first fine wire patterns is less than a width of the first wire portion, and
   wherein forming the second redistribution pattern includes:

forming a second seed layer on the first carrier substrate;
   forming a first conductive layer on the second seed layer; and
   forming a second seed pattern and a second conductive pattern on the second seed pattern by etching the second seed layer using the first conductive layer as a mask.

2. The method of claim 1, wherein forming the first conductive layer includes:
   forming a first resist pattern on the second seed layer;
   forming a first opening that exposes a top surface of the second seed layer in the first resist pattern; and
   performing an electroplating process using the second seed layer as an electrode in the first opening.

3. The method of claim 1, wherein forming the first redistribution pattern includes:
   forming a second insulating layer on the second redistribution pattern;
   forming a first hole by performing a patterning process on the second insulating layer;
   forming a second seed pattern on the first hole and a top surface of the second insulating layer; and
   forming a second conductive pattern on the second seed pattern.

4. The method of claim 3, wherein a diameter of an upper portion of the first hole is larger than a diameter of a lower portion of the first hole.

5. The method of claim 3, wherein an angle between a bottom and side surfaces of the first hole ranges from 95° to 135°.

6. The method of claim 1, wherein forming the under-bump pattern includes:
   forming a second insulating layer on the second redistribution pattern;
   forming a second hole by performing a patterning process on the second insulating layer; and
   forming the under-bump pattern to fill the second hole.

7. The method of claim 1, further comprising forming a conductive terminal on the under-bump pattern.

8. The method of claim 7, furthering comprising forming a third redistribution pattern on the second redistribution pattern,
   wherein forming the third redistribution pattern includes:
   forming a third insulating layer on the second redistribution pattern;
   forming a third hole by performing a patterning process on the third insulating layer;
   forming a third seed pattern on the third hole and a top surface of the third insulating layer; and
   forming a third conductive pattern on the third seed pattern,
   wherein a diameter of an upper portion of the third hole is larger than a diameter of a lower portion of the third hole.

9. The method of claim 8, wherein an angle between a bottom and side surfaces of the third hole ranges from 95° to 135°.

10. The method of claim 1, wherein a distance between adjacent first fine wire patterns ranges from 0.5 μm to 2 μm.

11. A method of manufacturing a semiconductor package, the method comprising:
   forming a preliminary semiconductor package by forming a first redistribution pattern, a second redistribution pattern and an under-bump pattern sequentially on a first carrier substrate;
   inverting the preliminary semiconductor package; and forming a third redistribution pattern on the first redistribution pattern, wherein the first redistribution pattern includes a first wire portion and first fine wire patterns, a width of the first fine wire patterns is less than a width of the first wire portion, wherein forming the second redistribution pattern includes:

forming a first insulating layer on the first redistribution pattern;

forming a first hole by performing a patterning process on the first insulating layer; and forming a second seed pattern and a second conductive pattern on the first hole and a top surface of the first insulating layer, wherein forming the third redistribution pattern includes:

forming a second insulating layer on the first redistribution pattern;

forming a second hole by performing a patterning process on the second insulating layer; and forming a second seed pattern and a second conductive pattern on the second hole and a top surface of the second insulating layer, wherein a diameter of an upper portion of the first hole is larger than a diameter of a lower portion of the first hole, and a diameter of an upper portion of the second hole is larger than a diameter of a lower portion of the second hole.

12. The method of claim 11, wherein an angle between a bottom and side surfaces of the first hole ranges from 95° to 135°, and an angle between a bottom and side surfaces of the second hole ranges from 95° to 135°.

13. The method of claim 11, forming the first redistribution pattern includes:

forming a first seed layer on the first carrier substrate;

forming a first conductive layer on the first seed layer; and forming a third seed pattern and a third conductive pattern on the third seed pattern by etching the first seed layer using the first conductive layer as a mask.

14. The method of claim 11, wherein a distance between adjacent first fine wire patterns ranges from 0.5 μm to 2 μm.

15. A method of manufacturing a semiconductor package, the method comprising:

forming a first redistribution pattern, a second redistribution pattern and an under-bump pattern sequentially on a first carrier substrate;

forming a preliminary semiconductor package by forming a conductive terminal on the under-bump pattern;

inverting the preliminary semiconductor package;

forming a first release layer on a second carrier substrate;

mounting the inverted semiconductor package in the first release layer;

forming a third redistribution pattern and a fourth redistribution pattern sequentially on the first redistribution pattern; and forming a boning pad on the fourth redistribution pattern, wherein the first redistribution pattern includes a first wire portion and first fine wire patterns, a width of the first fine wire patterns is less than a width of the first wire portion, and wherein forming the first redistribution pattern includes:

forming a first seed layer on the first carrier substrate;

forming a first resist pattern on the first seed layer;

forming a first opening that exposes a top surface of the first seed layer in the first resist pattern;

performing an electroplating process using the first seed layer as an electrode in the first opening; and forming a first seed pattern and a first conductive pattern on the first seed pattern by etching the first seed layer using the first conductive layer as a mask.

16. The method of claim 15, wherein forming the second redistribution pattern includes:

forming a first insulating layer on the first redistribution pattern;

forming a first hole by performing a patterning process on the first insulating layer;

forming a second seed pattern on the first hole and a top surface of the first insulating layer; and forming a second conductive pattern on the second seed pattern, and wherein a diameter of an upper portion of the first hole is larger than a diameter of a lower portion of the first hole.

17. The method of claim 16, wherein an angle between bottom and side surfaces of the first redistribution pattern is smaller than an angle between top and side surfaces of the first hole.

18. The method of claim 15, wherein forming the third redistribution pattern includes:

forming a third insulating layer on the first redistribution pattern;

forming a third hole by performing a patterning process on the third insulating layer;

forming a third seed pattern on the third hole and a top surface of the third insulating layer; and forming a third conductive pattern on the third seed pattern, wherein a diameter of an upper portion of the third hole is larger than a diameter of a lower portion of the third hole.

19. The method of claim 15, wherein a distance between adjacent first fine wire patterns ranges from 0.5 μm to 2 μm.

* * * * *